US007000212B2

(12) United States Patent
Agrawal et al.

(10) Patent No.: US 7,000,212 B2
(45) Date of Patent: Feb. 14, 2006

(54) HIERARCHICAL GENERAL INTERCONNECT ARCHITECTURE FOR HIGH DENSITY FPGA'S

(75) Inventors: Om P Agrawal, Los Altos, CA (US); Bradley A Sharpe-Geisler, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 392 days.

(21) Appl. No.: 10/406,050

(22) Filed: Apr. 2, 2003

(65) Prior Publication Data

US 2004/0010767 A1 Jan. 15, 2004

Related U.S. Application Data

(63) Continuation-in-part of application No. 10/194,771, filed on Jul. 12, 2002.

(51) Int. Cl.
*G06F 17/50* (2006.01)
(52) U.S. Cl. ............................. 716/17; 716/16; 326/37; 326/39
(58) Field of Classification Search ................. 326/37, 326/39; 716/16, 17
See application file for complete search history.

(56) References Cited

U.S. PATENT DOCUMENTS

| | | | | |
|---|---|---|---|---|
| 5,598,346 A | * | 1/1997 | Agrawal et al. ............... 716/16 |
| 5,883,525 A | * | 3/1999 | Tavana et al. ................. 326/39 |
| 6,118,298 A | * | 9/2000 | Bauer et al. .................... 326/39 |
| 6,130,550 A | * | 10/2000 | Zaliznyak et al. ............. 326/39 |
| 6,239,613 B1 | * | 5/2001 | Reddy et al. .................. 326/39 |
| 6,766,505 B1 | * | 7/2004 | Rangan et al. ................ 716/16 |
| 6,769,107 B1 | * | 7/2004 | Watkins ........................ 716/16 |

FOREIGN PATENT DOCUMENTS

| EP | 461798 A2 | * | 12/1991 |
|---|---|---|---|
| WO | WO 9933177 A1 | * | 7/1999 |

* cited by examiner

Primary Examiner—Stacy A. Whitmore

(57) ABSTRACT

Field programmable gate arrays (FPGA's) may be structured in accordance with the disclosure to have a hierarchical general interconnect architecture in which: (1) reliance on single-length general interconnect lines is avoided; (2) the next greater length of general interconnect line is at least double-reach length (triple span); and (3) yet greater lengths of general interconnect line (e.g., Deca-Reach Length, or 11-span) can feed signals into logic blocks indirectly through switching resources of the shorter length, general interconnect line rather than feeding such signals directly into the logic blocks through their own respective switching resources. Additionally, the yet greater lengths of general interconnect line (e.g., Deca-Reach Length) have a fewer number of signal tap points on them than the number of logic blocks spanned by such longer ones of the general interconnect lines. Navigation limiting rules may be established to reduce the number of drive buffers needed for driving signals onto the longer ones of the general interconnect lines. In one embodiment, there are no drive buffers for middle tap points of the longer ones of the general interconnect lines.

11 Claims, 14 Drawing Sheets

(Prior Art Trend)

200

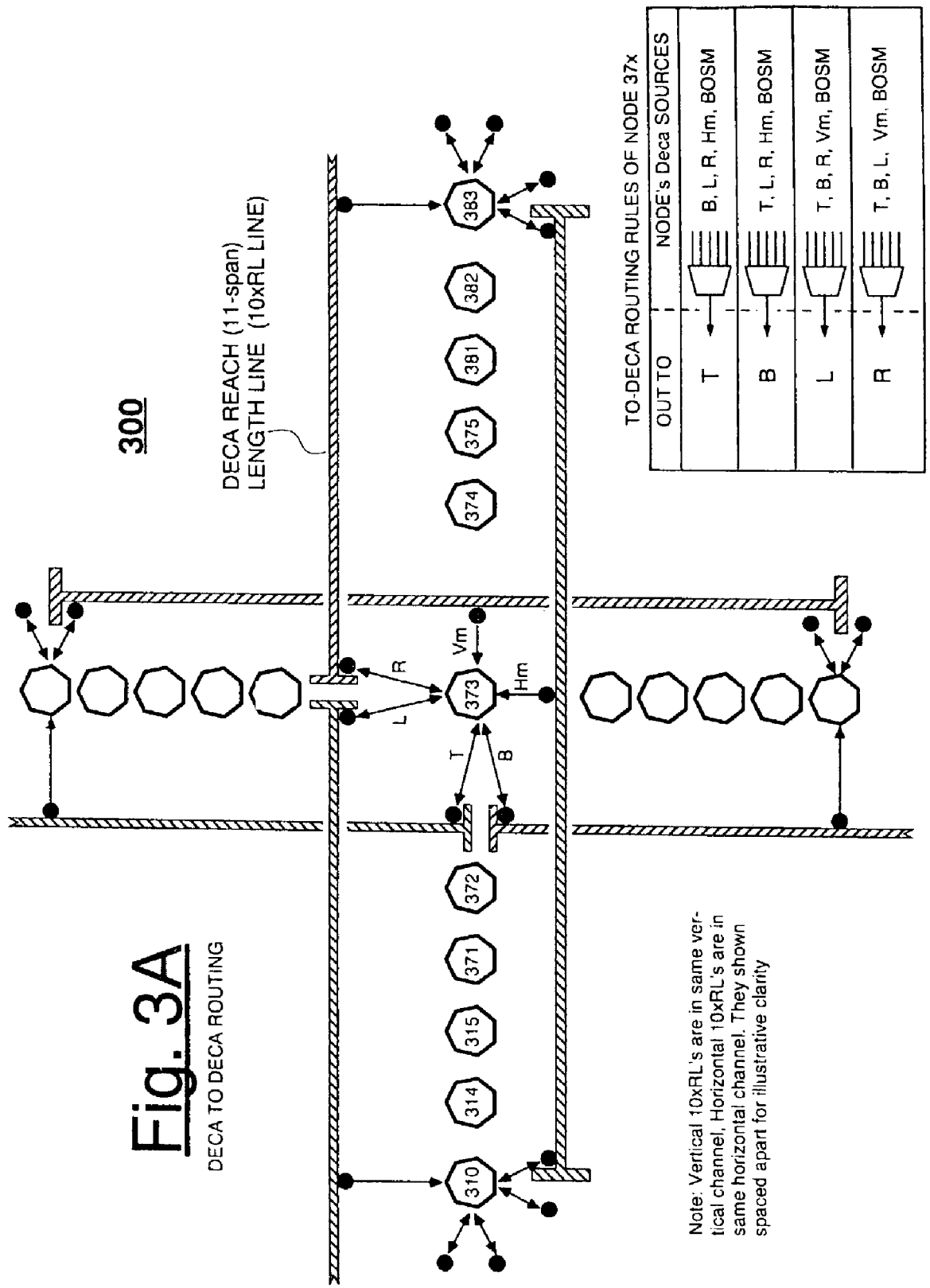

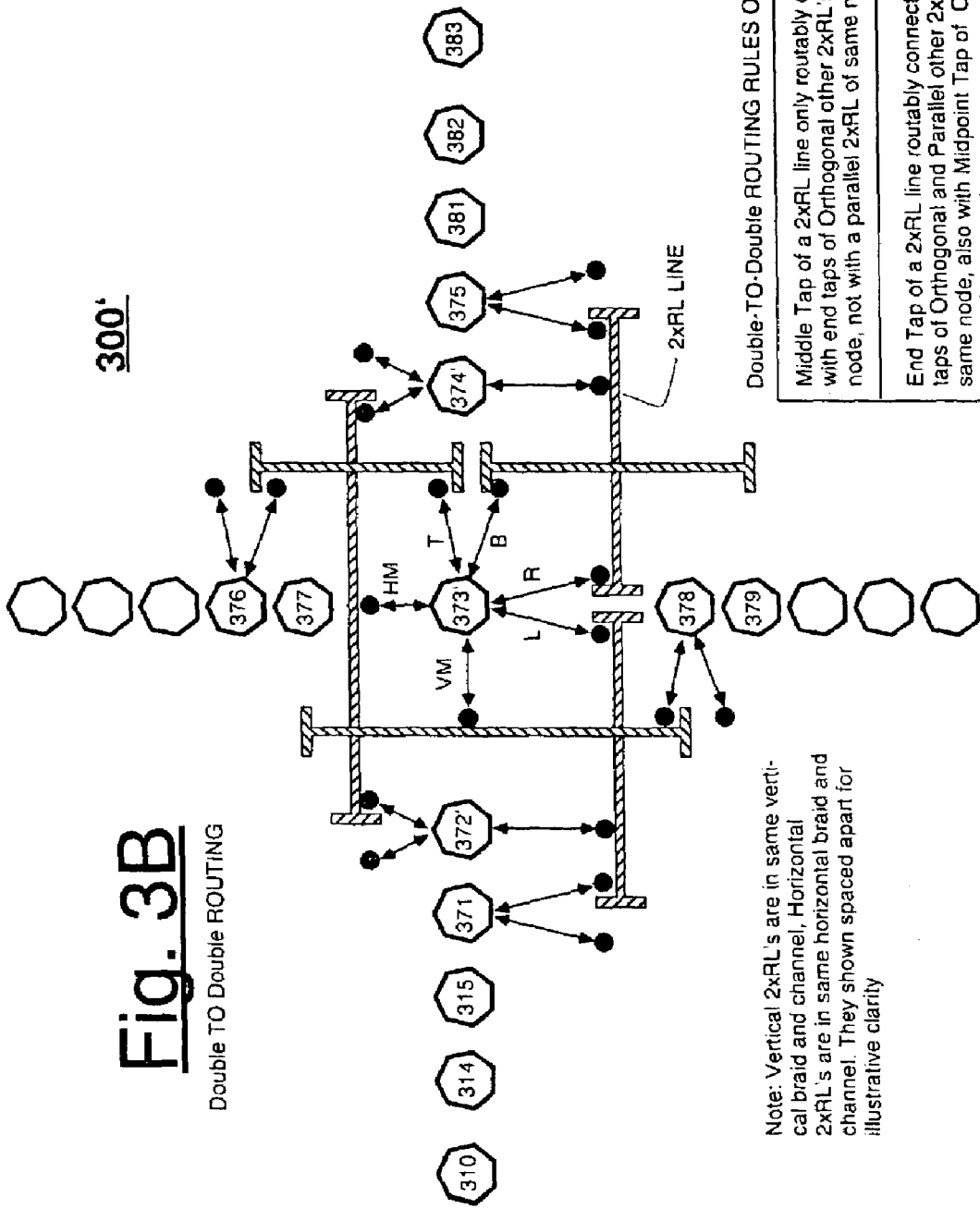

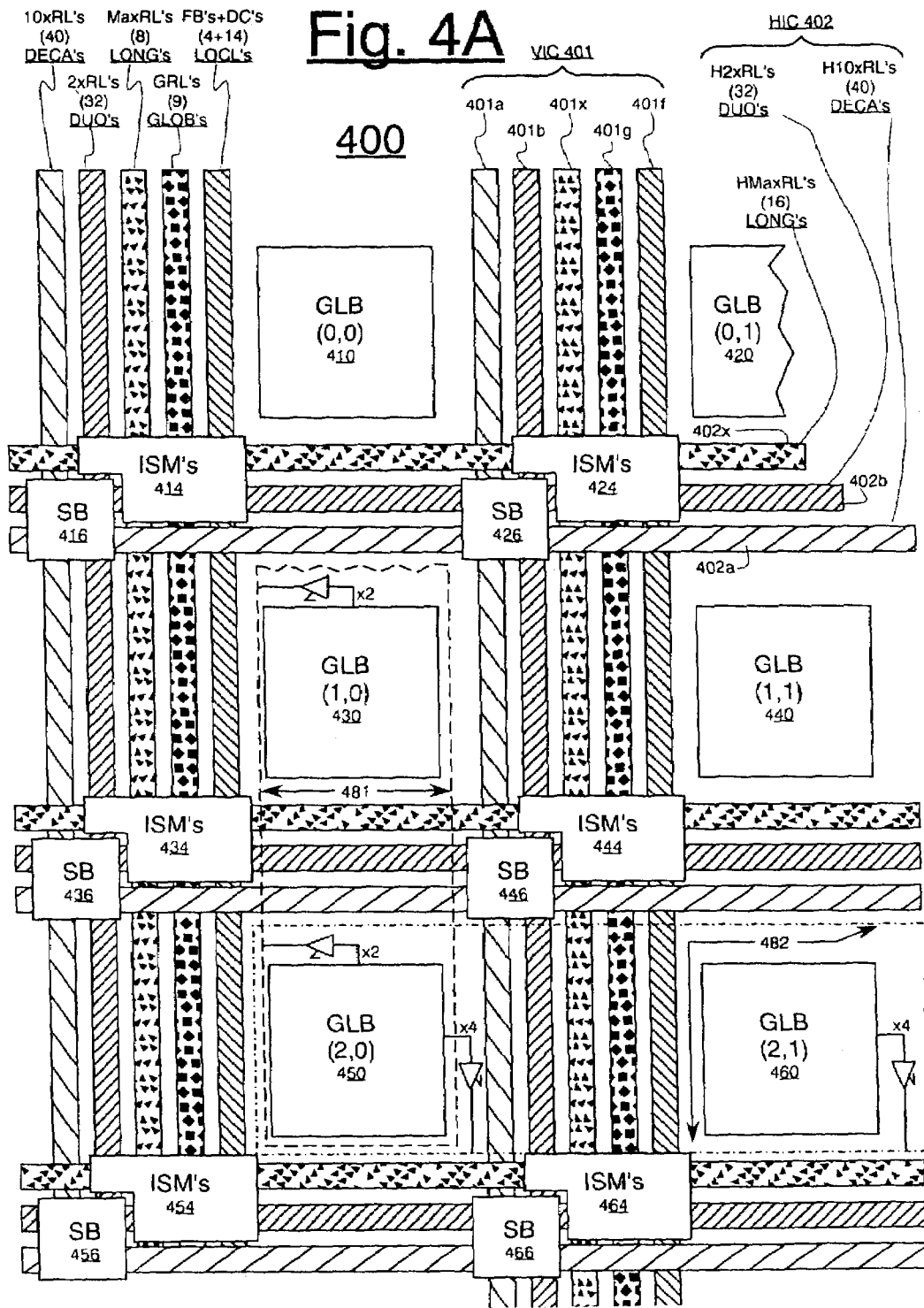

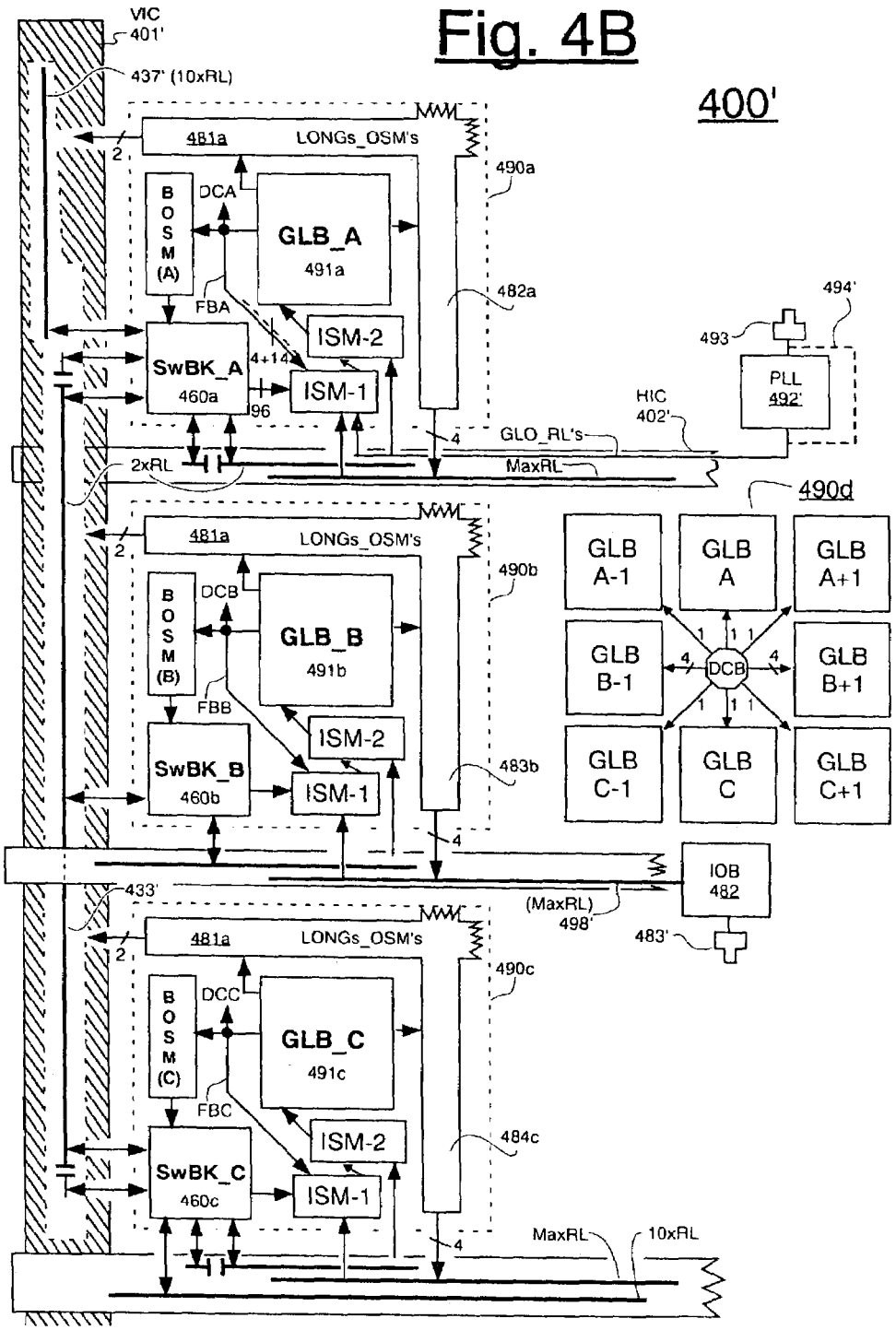

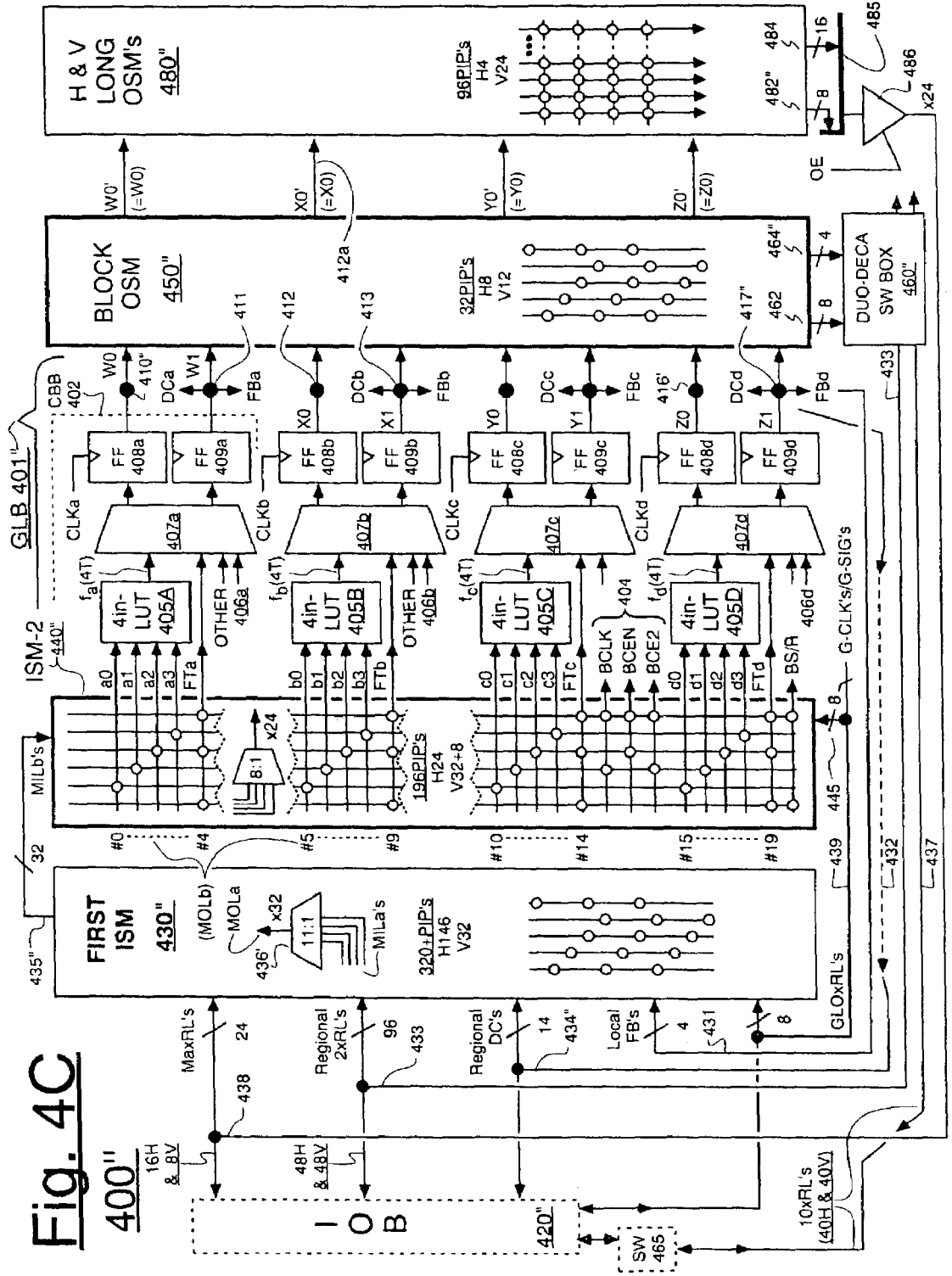
Fig. 4C 400"

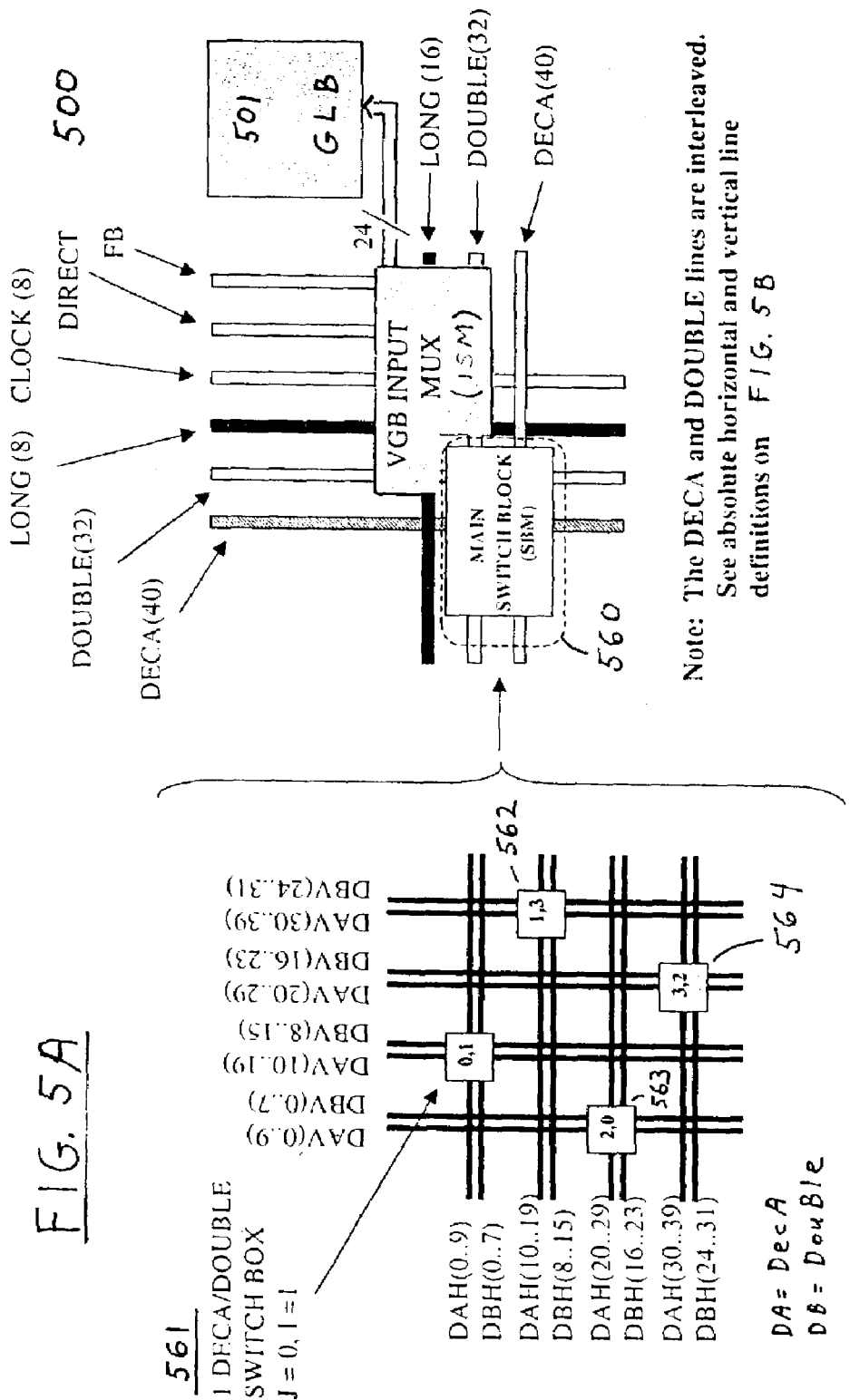

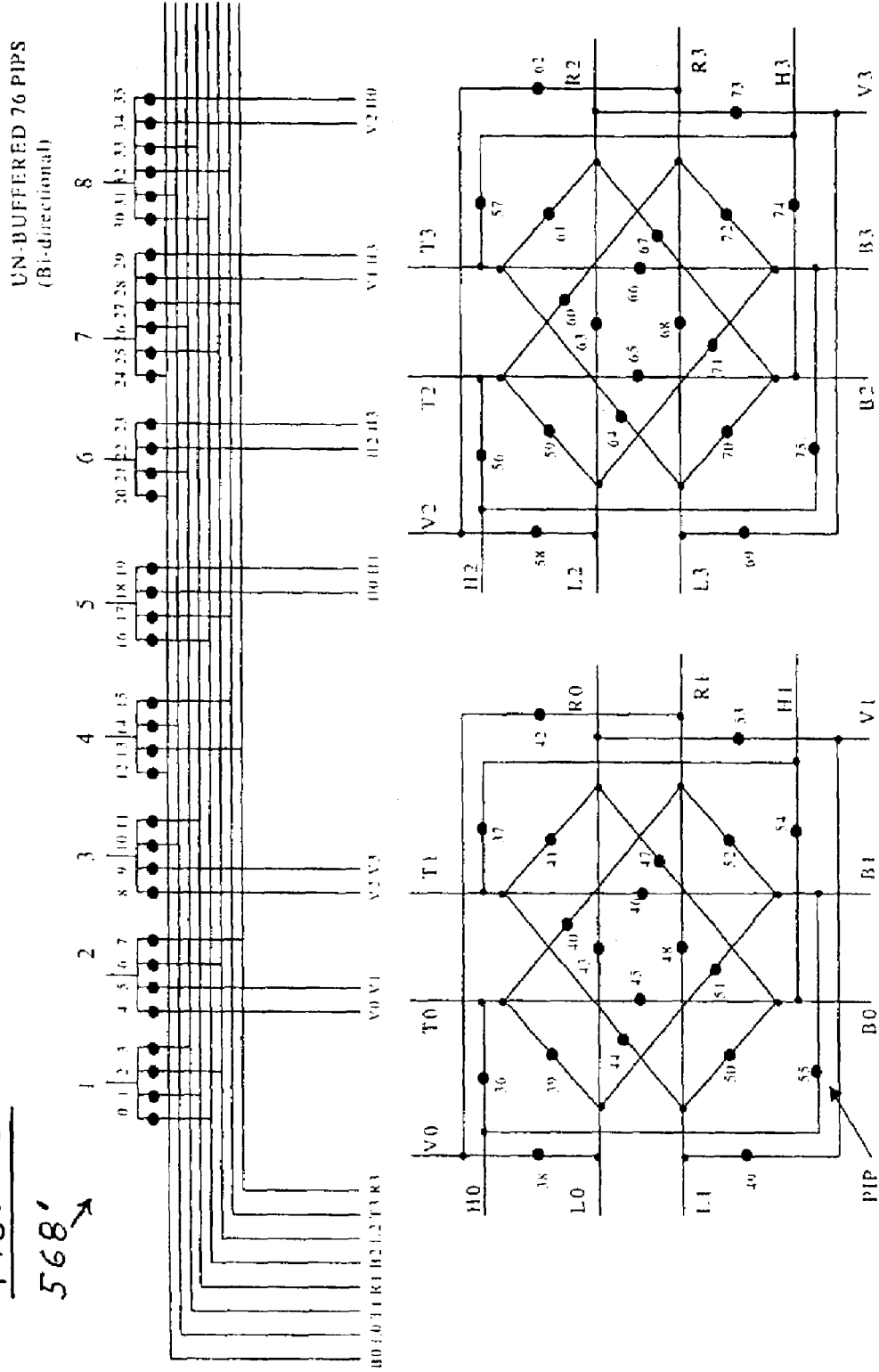

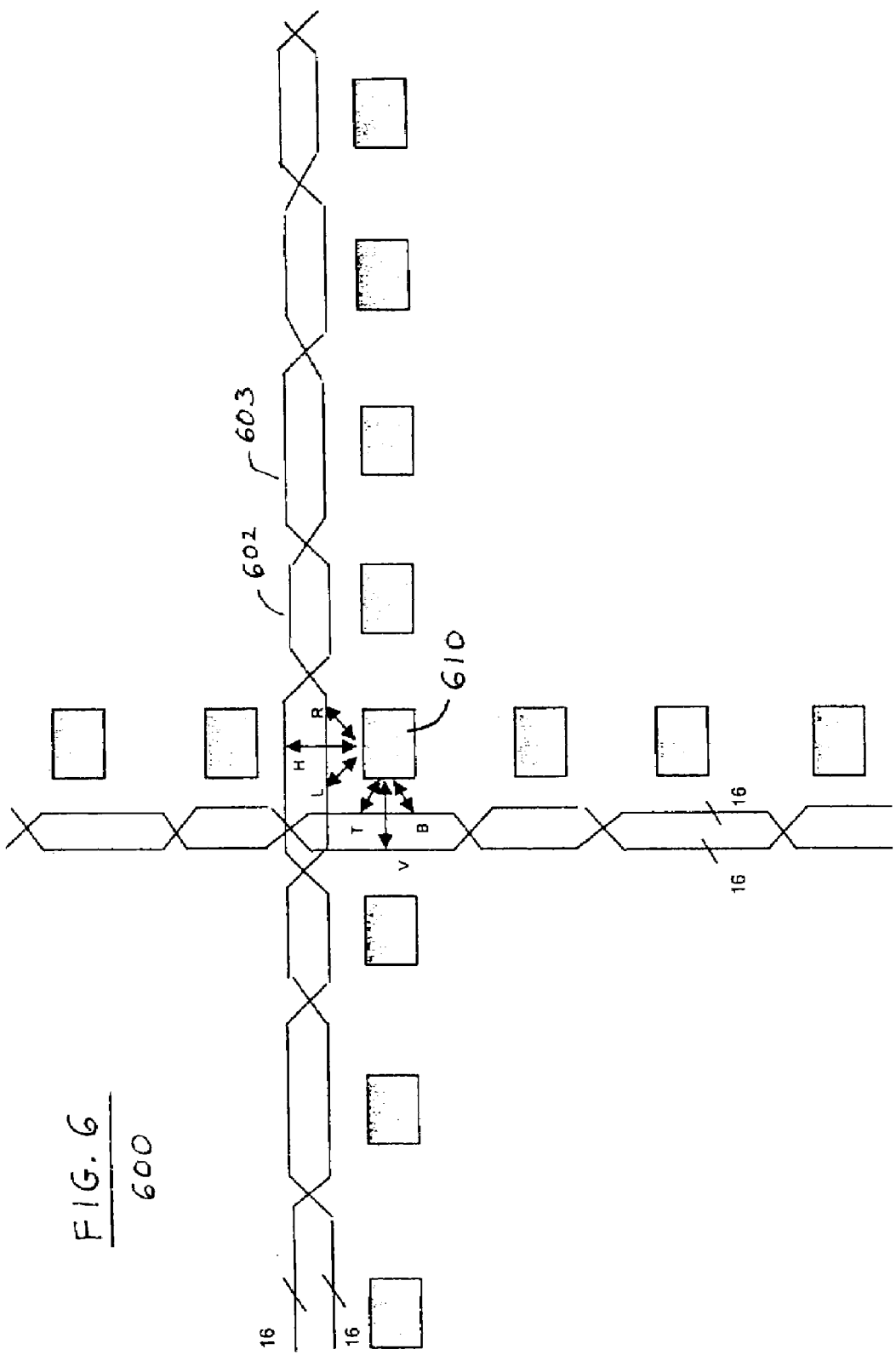

700

HIERARCHICAL GENERAL INTERCONNECT ARCHITECTURE FOR HIGH DENSITY FPGA'S

RELATED APPLICATION DATA

The application is a continuation-in-part (CIP) of U.S. application Ser. No. 10/194,771 filed Jul. 12, 2002 and incorporates by reference the disclosure of said parent application.

CROSS REFERENCE TO CO-OWNED APPLICATIONS

The following copending U.S. patent applications are owned by the owner of the present application, and their disclosures are incorporated herein by reference:

(A) Ser. No. 10/090,209 filed Mar. 4, 2002 as a divisional of Ser. No. 09/626,094 which was previously filed Jul. 26, 2000 by Om P. Agrawal et al. and originally entitled, "VARIABLE GRAIN ARCHITECTURE FOR FPGA INTEGRATED CIRCUITS"; and (B) Ser. No. 10/194,771 filed Jul. 12, 2002 by Om P. Agrawal et al. and originally entitled, "FPGA DEVICES HAVING REGISTER-INTENSIVE ARCHITECTURE, REGISTER-ABLE FEED-THROUGHS, MULTI-STAGE INPUT SWITCH MATRIX AND METHODS OF USING SAME".

CROSS REFERENCE TO PATENTS

The disclosures of the following U.S. patents are incorporated herein by reference:

(A) U.S. Pat. No. 6,470,485 based on Ser. No. 09/692,694 filed Oct. 18, 2000 by Richard T. Cote, et al. and originally entitled, Scalable and Parallel Processing Methods and Structures for Testing Configurable Interconnect Network in FPGA Device; and (B) U.S. Pat. No. 6,097,212 issued Aug. 1, 2000 to Om P. Agrawal et al, (filed as Ser. No. 08/948,306 on Oct. 9, 1997) and entitled, Variable Grain Architecture for FPGA Integrated Circuits.

TECHNICAL FIELD

The present disclosure of invention relates to circuits which have repeated configurable logic and configurable interconnect structures provided therein and to methods for configuring the same. Examples of such circuits include Field Programmable Gate Arrays (FPGA's).

The disclosure relates more specifically to problems which may be associated with efficient implementation of a scalable, general-use programmable interconnect between repeat logic blocks such as those provided within an integrated circuit monolith that contains a field programmable gate array (FPGA).

BACKGROUND

Like many other kinds of integrated circuits (IC's), those with programmable types of interconnect have historically continued to grow in terms of circuit density and complexity. Signal-processing speed has also tended to increase. As a result, the following attributes have become areas of growing concern: the robustness of the programmable interconnect, its ability to avoid signal traffic congestion, and its ability to avoid excessive consumptions of electrical power at localized points (e.g., due to high frequency driving of high capacitance loads).

Typically, designers try to throw in larger numbers of "general interconnect" lines and greater varieties of such into the programmable routing resources of FPGA's in order to try to assure that the various programmable logic sections (e.g., CLB's or Configurable Logic Blocks) in the IC will be able to acquire a wide variety of input signals and/or deliver respective output signals from/to other such CLB's and/or from/to I/O Blocks (IOB's) in timely and deterministic fashion; this being done so that appropriate communication can take place between such spaced-apart logic or other sections of the IC as may be required for programmably implementing desired logic functions. "General interconnect" lines are those which are not dedicated for use only by specific drive circuits or are not dedicated for specific functions (e.g., carrying memory address signals). Such general interconnect lines can be assigned by place-and-route software for use by any of a multitude of signal sources and/or for any of a multitude of functions.

The brute force solution of simply adding more and more general interconnect lines of different lengths and orientations into a programmable IC is all well and good. However, as circuit and interconnect densities grow it becomes more difficult to make efficient use of circuit resources while at the same time comporting with limitations on power consumption. For example, it may not be wise to drive a high frequency signal onto a relatively long gi-line (a general interconnect line with relatively large electrical capacitance) merely to couple the signal from one CLB to an immediately adjacent CLB. A shorter interconnect line may be more efficient. Most of the circuit space consumed by the length of the relatively long gi-line (e.g., an octal length line) will be wasted. Also, energy will be wasted in driving the greater capacitance of the long gi-line at high frequency. On the other hand, if there are too many relatively short gi-lines (e.g., those with a length of say, one CLB tile; defined as 1×CL below) then a large signal propagation time may be disadvantageously incurred if a signal has to be transported a relatively long distance by use of such short-haul gi-lines. The delay will be due to the many routing switches that are disposed along the way for provided programmable routing from each short gi-line (e.g., 1×CL) to the next. Aside from loading the routing lines, the many routing switches disadvantageously consume circuit space which might otherwise be used for providing higher logic density.

It is difficult to find a correct balance of interconnect resources. It is difficult to determine what mix of long-haul and short-haul gi-lines will efficiently implement all different kinds of designs that are to be programmably implemented in an FPGA.

Practitioners skilled in the art of once-programmable or re-programmable logic arrays such as Field Programmable Gate Arrays (FPGA's) have come to recognize the benefits of using a varied-granularity of interconnects wherein conductors of differing lengths (e.g., double-length, quad-length, etc.) are used, and where the conductors may further be of differing orientations, and where the types of interconnect may have other differing attributes (including differing drive capabilities such as tristateable, or not) in accordance with concepts introduced for example, in U.S. Pat. No. 5,185,706 issued Feb. 9, 1993 to Om P. Agrawal et al. To some extent, the growing lists of different kinds of interconnect (e.g., short-haul general interconnect, medium-haul general interconnect, long-haul general interconnect, dedicated non-general interconnect, etc.) has become a curse. Place-and-route software has to contend with a growing list of different kinds of interconnect and different navigation options available for each kind of interconnect resource at each position in the programmable circuitry. This creates a scalability problem.

SUMMARY

Structures and methods may be provided in accordance with the present disclosure of invention for overcoming one or more of the above-described problems.

In accordance with one aspect of the present disclosure, FPGA's are structured to have a hierarchical type of general interconnect wherein: (1) reliance on single-length general interconnect lines (1×CL lines, described below) is avoided; (2) the next greater length of general interconnect line is at least double-reach length (2×RL, described below); and (3) yet greater lengths of general interconnect line (e.g., 10×RL, described below) can feed signals into logic blocks (e.g., CLB's) indirectly through switching resources of the shorter length, general interconnect line (e.g., 2×RL lines) rather than feeding them directly into the logic blocks through their own respective switching resources. In other words, when it comes to feeding input signals into the logic and/or storage resources that are, so-to-speak "housed" within a logic block construct, general interconnect entry is made by way of the "local streets" (e.g., 2×RL lines) rather than directly from longer-haul "elevated avenues" or "bridges" (e.g., 10×RL lines) of the general interconnect. Exit from the houses can be differently handled from entrance into the houses. In one embodiment, although general interconnect entrance has to be made by way of the shorter "street" conductors, exit (signal output) can be made directly from a logic block to an adjacent tap point of a corresponding "elevated avenue" (e.g., a 10×RL line) without consuming a local street for getting that signal out.

In accordance with a further aspect of the present disclosure, the number of signal injection/extraction points (tap points) on the relatively longer ones of the general interconnect lines is less than the number of logic blocks spanned by such relatively longer general interconnect lines. In other words, the longer general interconnect lines ("elevated avenues") are sparsely tapped. In one embodiment, for example, a general-interconnect line which spans 11 logic blocks (a so-called 10×RL line) has only 3 tap points: two at its ends and one in the middle. Another further aspect is that not all the taps of the longer general interconnect lines are buffered. In other words, the taps of the longer general interconnect lines ("avenues"/"bridges") are sparsely buffered. In one embodiment, for example, only the two end taps of a 10×RL line are driven by buffers configured for handling the larger electrical capacitance of a 10×RL line (as opposed to a shorter 2×RL line) the middle tap of the 10×RL line is unbuffered.

Other aspects of the disclosure will become apparent from the below detailed description.

BRIEF DESCRIPTION OF THE DRAWINGS

The below detailed description section makes reference to the accompanying drawings, in which:

FIG. 3A is a schematic showing a Deca-to-Deca routing scheme may be implemented in accordance with the present disclosure;

FIG. 3B is a schematic showing a Double-to-Double routing scheme which may be implemented in accordance with the present disclosure;

FIG. 4A is a block diagram of an interconnect structure organized in accordance with the present disclosure;

FIG. 4B is a more detailed schematic of a logic and interconnect structure which may be used in an embodiment such as that of FIG. 4A;

FIG. 4C is a yet more detailed schematic of a logic and interconnect structure which may be used in an embodiment such as that of FIG. 4B;

FIG. 5A is a block diagram of an embodiment in which a main switchbox comprises four, staggered subboxes;

FIG. 5C is a yet more detailed schematic of a Doubles switch area within a subbox of a FIG. 5B;

FIG. 6 is a block diagram of an embodiment in which Double-Reach Length buses are braided.

DETAILED DESCRIPTION

Figure 1:
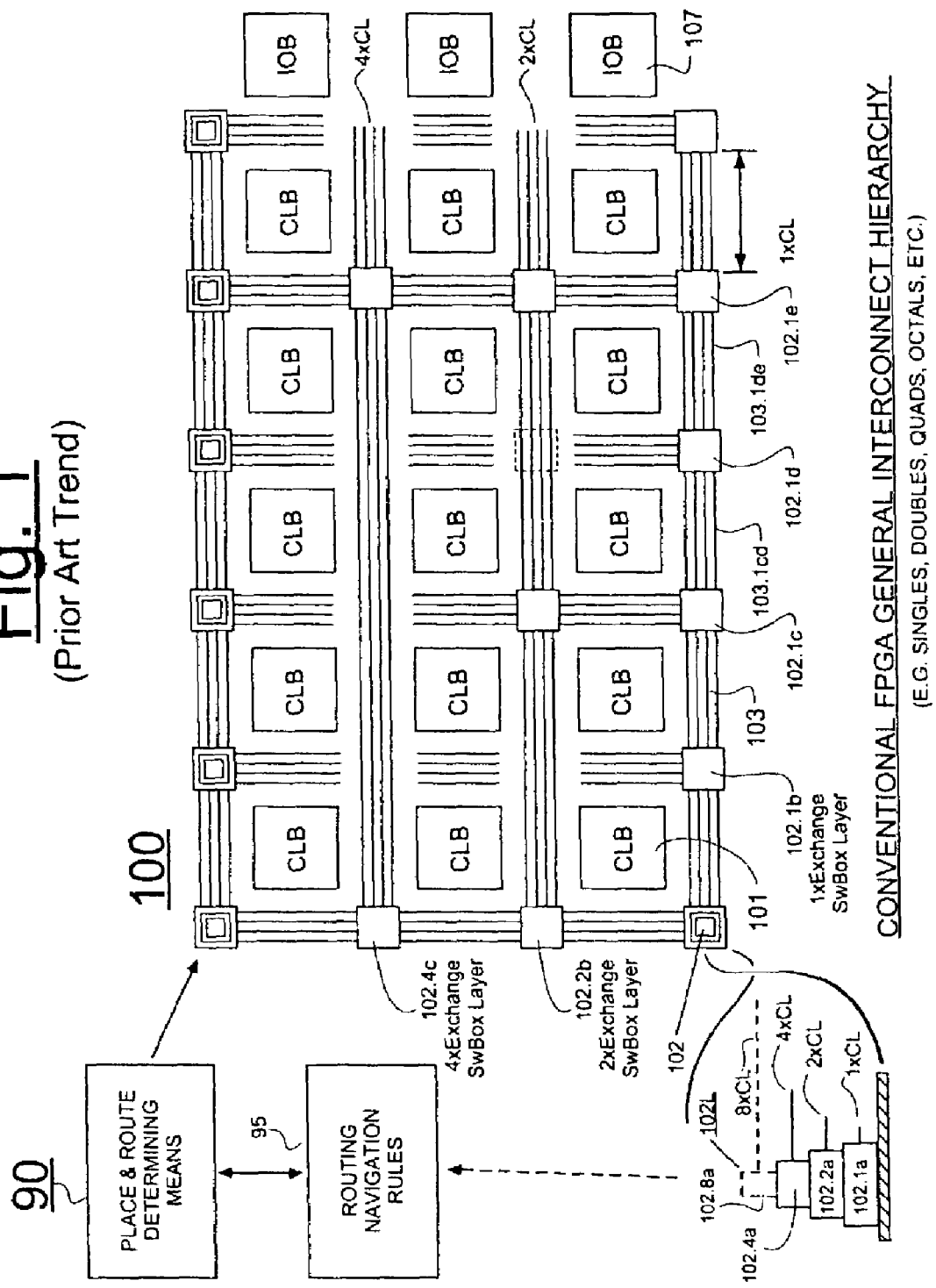
FIG. 1 illustrates in a general way, an FPGA and its associated place-and-route software, where the FPGA is comprised of an array of Configurable Logic Blocks (CLB's), a general-purpose interconnect network, and Input/Output Blocks (IOB's) for interfacing to external circuitry.

FIG. 1 introduces a problem that exists in conventional FPGA designs which use general interconnect lines of many differing kinds. A first integrated circuit device 100 having a conventional FPGA layout is shown. It is to be understood that FPGA 100 is to be programmably configured in accordance with configuration signals obtained or derived from a place-and-route determining means 90 (e.g., place-and-route software executing in an instructable other machine). Operations of the placer-and-router 90 are controlled in part by routing navigation rules 95 associated with the interconnect structure of the to-be-configured FPGA.

A relatively simplistic layout is shown in FIG. 1 for the purpose of introducing readers to some of the fundamental problems that have come to be associated with modern FPGA structures. As seen in FIG. 1, a regular pattern of Configurable Logic Blocks (CLB's) is distributed between intersecting vertical and horizontal interconnect channels. Signal-routing switchboxes are provided at the channel intersections. A plurality of Input/Output Blocks (IOB's) may be distributed about the periphery of, and/or elsewhere in the device 100 (only a few IOB's are shown, such as the one at 107).

One of the CLB's in FIG. 1 is denoted as 101. Furthermore, one of the channel-interconnecting switchboxes is denoted as 102 (SwBox). The top plan view of SwBox 102 is shown to be schematically rotated into becoming a side-view icon 102L. This icon 102L (bottom left corner) shows that SwBox 102 may be conceptualized as having a hypothetical set of many layers each dedicated to servicing a different length of general interconnect lines. Layer 102.1 for example is associated with 'single-length' conductor segments. The next higher layer, 102.2 is associated with 'double-length' conductor segments, while the yet next higher layer, 102.4 is associated with 'quad-length' conductor segments, and so on. It is not only SwBox 102, but all switchboxes in FIG. 1 that may be thought of as having such hypothetical layers each associated with a respective shorter set or longer set of limited-length conductors. More specifically, a first set of relatively short, horizontal conductors in FIG. 1 is denoted as bus 103 and its conductor segments each extend continuously between but not substantially beyond immediately adjacent switchboxes such as those represented by switchbox sections 102.1*b* and 102.1*c*. Each such conductor segment within bus 103 may be referred to as a single-length, general interconnect line (a 1×CL line) because its continuity extends roughly the distance of a single CLB tile. Bus 103.1*cd* similarly consists of single-length conductors coupling SwBox section 102.1*c* to 102.*d*. Bus 103.1*de* similarly consists of 1×CL conductors coupling SwBox section 102.1*d* to 102.*e*.

Other interconnect buses FPGA 100 may be conceptualized as being stacked on top of the 1×CL buses even though not all are shown. The various longer-length buses may be thought of as being stacked on top of one another and atop the 1×CL lines in the respective channels. Thus the 102.2*a* and 102.4*a* layers of switchbox 102 are understood to respectively have 2×CL and 4×CL conductors extending from them even though not shown at corner 102. Such 2×CL and 4×CL horizontal conductors are revealed in the respective rows of switchbox sections 102.2*b* and 102.4*c*. In one embodiment, a 102.8*a* layer is included in each switchbox (e.g., 102L) and this further layer has 8×CL conductors (octal length segments) extending from it. One could also have hexadecimal length, general interconnect lines (16×CL) and so forth. Internals of the switchboxes (e.g., 102) are designed in accordance with the routing navigation rules, where the latter define how signals may hop from one general interconnect line to the next (e.g., from a 1×CL to another 1×CL or from a 4×CL to a 1×CL).

In summary, it may be understood from FIG. 1 that general interconnect line segments (e.g., 1×CL segments) and their associated switchbox sections (e.g., 102.1*a*, 102.1*b*, 102.1*c*) appear at every interconnect channel intersection although not all are shown in FIG. 1. It is further to be understood that in some embodiments, staggered versions of the double-length segments (2×CL) and their associated switchbox sections may appear at every interconnect channel intersection. Moreover, position staggered versions of the quad-length segments (4×CL) may appear at every interconnect channel intersection; and so on. The possible presence of such switchbox sections at every interconnect channel intersection is represented by the dashed square drawn in the horizontal channel drawn above switchbox section 102.1*d*.

With so many different kinds of general interconnect segments (e.g., 1×CL, 2×CL, 4×CL, etc.) present in each of the vertical and horizontal interconnect channels, and with the number of intersections increasing in successive design generations, an exponentially growing problem presents itself to the place-and-route software 90. The latter software has to tackle the difficult task of complying with the navigation rules 95 of the FPGA 100 and of deciding how to efficiently route each signal through the various kinds of general interconnect resources such that all signals get to their intended destinations in timely fashion without wasting circuit space or power. The problem is exacerbated if routing navigation options (95) inside and/or between each of the hypothetical switchbox layers (e.g., 102.1*a*, 102.2*a*, 102.4*a*) vary according to the layer or layers involved (e.g., 1×CL-to-1×CL, 1×CL-to-2×CL, 2×CL-to-2×CL, 1×CL-to-4×CL, etc.)

Figure 2A:
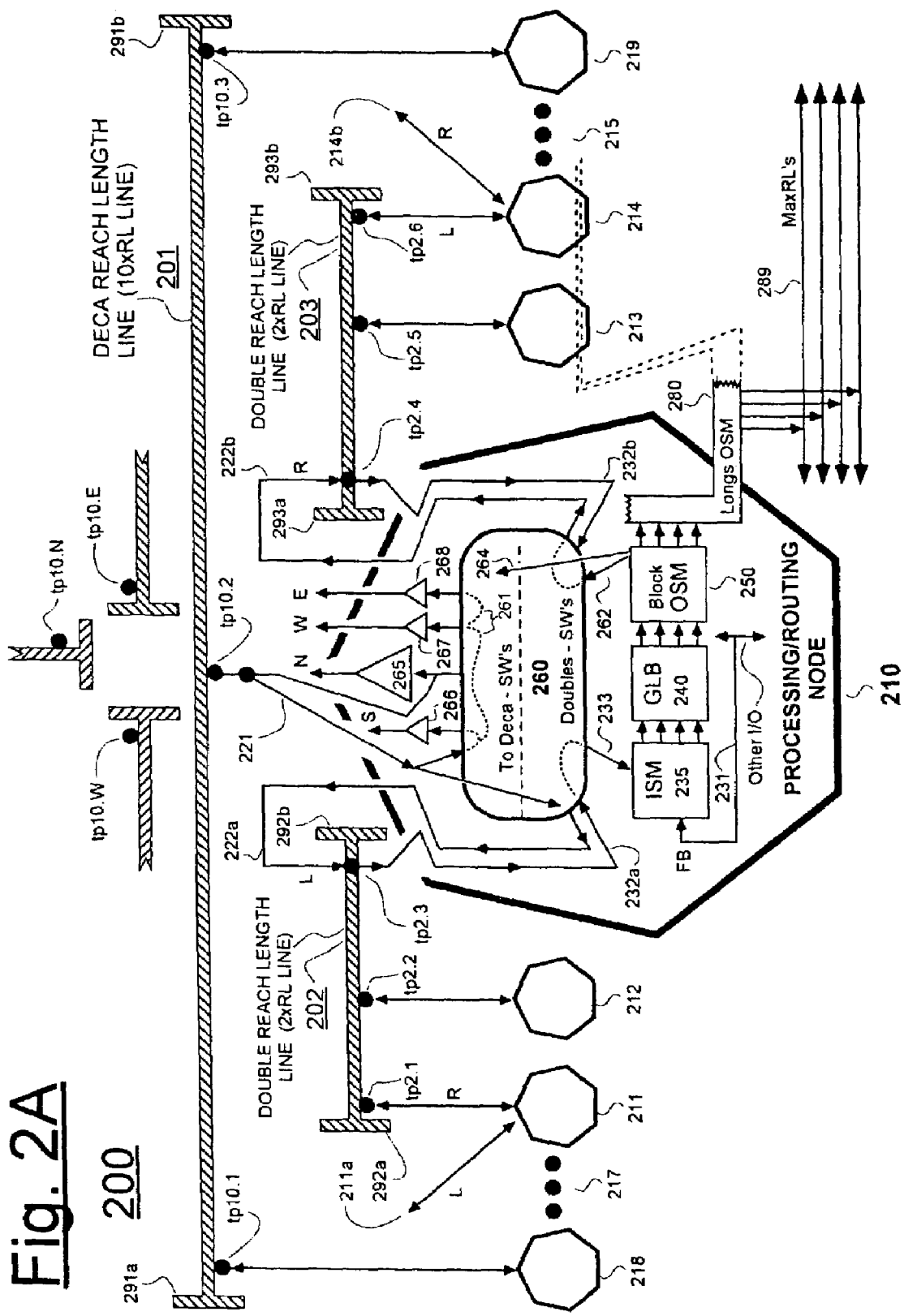
FIG. 2A introduces a first Duo-Deca type of general interconnect may be provided within a variable-grain FPGA in accordance with the present disclosure.

Because each switchbox layer consumes circuit space and power, it becomes desirable to provide a general interconnect architecture that allows for a reduced number of general interconnect types and a reduced number of signal tap points (points where signals are injected into or extracted from interconnect lines). FIG. 2A shows a first embodiment 200 of such an architecture. There are only two types of "general interconnect" line segments in this embodiment 200: Double-Reach Length lines and Deca-Reach Length lines.

The Double-Reach Length lines are also denoted as 2×RL lines and each has 3 signal tap points corresponding to the 3 "nodes" spanned by the 2×RL line. For example, the 2×RL line identified as 202 has respective left, middle and right tap points: tp2.1, tp2.2 and tp2.3. Each 2×RL line has a span of 3 nodes, meaning that each such 2×RL line runs adjacent to, and can immediately connect to just 3 switchboxes (e.g., 260) of its respectively spanned 3 nodes (e.g., 210, 211 and 212 for line 202). Note that the length of a 2×RL line can be just that of about two GLB tiles because extension into only about half of each end tile may be required before terminating into a PIP. (A GLB is a form of logic block. In some instances, alternative names may be assigned to such a repeated, programmable function unit, such as for example, "PFU".) The short-haul general interconnect lines (e.g., 2×RL's) of the illustrated architecture may be considered to be "densely tapped" because there is a tap point for every node that is "spanned" by the short-haul line. Such short-haul general interconnect lines (e.g., 2×RL's) are intended to function as the primary workhorses of the overall, general interconnect structure. They are the local public "streets" through which entry may be made into the private node houses, where the private node houses each contain specific logic and/or storage resources as well as signal routing resources.

The Deca-Reach Length lines are further denoted as 10×RL lines and each has 3 signal tap points. For example, the single 10×RL line shown at 201 as respective left, middle and right tap points: tp10.1, tp10.2 and tp10.3. Each 10×RL line has a span of 11 processing nodes, meaning that each such 10×RL line runs adjacent to, and could (but does not necessarily) immediately connect to just 11 switchboxes (e.g., 260) of its respectively spanned 11 nodes (e.g., 210–219, where only 7 of the 11 are shown and 215, 217 represent the other 4). This 11-node spanning attribute of a Deca-line may be better seen for the 10×RL line 201' shown in FIG. 2B. Note again that a 10×RL line need not have length of more than 10 GLB tiles because extension only about halfway into each of the end tiles may be sufficient. The longer-haul general interconnect lines (e.g., 10×RL's) of the illustrated architecture may be considered to be "sparsely tapped" because there is less than one tap point for every node that is spanned by the longer-haul line. Such longer-haul general interconnect lines (e.g., 10×RL's) are intended to function as auxiliary fast paths that allow for navigated hops (bridgings) between far apart ones of the primary workhorses (the 2×RL's) and thus help the primary workhorses to more quickly route signals through the general interconnect structure. The longer-haul general interconnect bridges (e.g., 10×RL's) may be thought of as elevated public "avenues" from which entry cannot be made directly into the private node houses. Instead, an avenue-carried signal has to drop down to a local public street before being able to enter a private node house that contains specific logic and/or storage resources as well as signal routing resources.

Although it is not explicitly noted in FIG. 2A, it is to be understood that there are no 1×CL general interconnect lines (gi-lines) in embodiment 200, nor are there any 2×CL gi-lines or 4×CL gi-lines or 8×CL gi-lines. The 2×RL lines and 10×RL lines provide for all the general interconnect needs of the associated FPGA. Short-haul interconnect functions may be provided by specialized types of additional lines such as 'Direct-connects' and 'Feedbacks' (FB's, shown at 231 in FIG. 2A). Significantly longer-haul interconnect functions may be provided by further specialized types of lines such as 'LongLines' (MaxRL lines, shown at 289 in FIG. 2A) and 'Global Lines' (not shown). These possible types of specialized interconnects are schematically shown in FIGS. 4A–4C.

An advantage to having a hierarchical, general interconnect of the type introduced in FIG. 2A is that switchbox circuitry is not wasted on providing all possible variations of routing signals among many different kinds of general interconnect. Each Double-Reach Length (2×RL) line functions as a sort of local street that allows a first processing/routing node (e.g., 210) on the 2×RL line to send a same result signal immediately to two further nodes on the same 2×RL line. For example, in FIG. 2A, the output arrows on the "Left" (L) Double driving line, 222a of node 210 may represent a first result signal (say from bus 262) being output from first processing (e.g., 240) in node 210 and being coupled into the right end tap point, tp2.3 of Double-Reach Length line 202. The first result signal (222a) may then travel via the so-driven 2×RL line 202 to destination nodes 211 and 212. Either of nodes 211 and 212 may alternatively serve as the signal source while node 210 and/or the other of 211-212 serves as the destination for a signal conveyed by this 2×RL line 202.

At the same time, the output arrows on the "Right" (R) Double driving line, 222b of node 210 may represent either the first signal, or it may represent a second result signal (also from bus 262) that is being output from corresponding processing (240) in node 210 and being coupled into left-end tap point, tp2.4. The first or second result signal may then travel via the right side, 2×RL line 203 to destination nodes 213 and 214. Either of nodes 213 and 214 may alternatively serve as the signal source while node 210 and/or the other of 213–214 serves as the destination for a signal conveyed by this right side, 2×RL line 203. Thus, by using its respective Left and Right Double-driving connections (222a and 222b), a given node (210) can conveniently send either of first and second result signals (each derived from bus 262 and coupled via line 222a or 222b) respectively to Left and/or Right adjacent pairs of destination nodes (211–212 and 213–214) or it can send a same result signal to the four adjacent pairs of nodes (211–212 and 213–214), this being done while consuming just two 2×RL lines (202, 203) and the associated PIP's (programmable interconnect points) in switchbox 260.

Signals may cascade from one 2×RL line to the next. Thus, the Left distal node 211 of FIG. 2A may be programmed to forward the first signal (222a) to a further 2×RL line (not shown) via its "Left" (L) Double driving line 211a. The Right distal node 214 may be similarly programmed to cascade the first or second signal forward to a further 2×RL line (not shown) via its "Right" (R) Double driving line 214b.

For identification purposes, T-shaped termination icons are used in the schematics to represent the Left and Right (or Top and Bottom) Terminal ends of the illustrated 2×RL or 10×RL lines. Thus, T-shaped icons 292a, 292b represent the terminal ends of the first mentioned, Double-Reach Length line, 202. T-shaped icons 293a, 293b represent the terminal ends of the second mentioned, 2×RL line, 203. Similarly, T-shaped icons 291a, 291b represent the terminal ends of horizontal Deca-Reach Length line 201. This first 10×RL line, 201 may be viewed as an elevated, high speed bridge that allows a local street signal to quickly leap over a few local streets and jump from a first node (say 218) to a node spaced 10 slots away (say 219). In one embodiment, the middle node (e.g., 210) of a given Deca-Reach Length line (e.g., 201) cannot pump a buffered signal up to the elevated bridge (201) above it. Thus the middle node (e.g., 210) cannot use the middle-tap (tp10.2) above it as a fast path connection. It can however, send an unbuffered signal up to the bridge. This is useful for cases where the programmable connection does not need relatively short propagation times. More on this below.

Referring to the internal structures illustrated within processing/routing node 210 of FIG. 2A, a multi-stage, input switch matrix (ISM) 235 is provided for selectively acquiring signals from adjacent interconnect lines. (See also, First ISM stage 430 of FIG. 4C.) Examples of adjacent and selectable inputs include the local tap points of local 2×RL lines (which enter ISM 235 via bus 233) and local feedbacks 231. The ISM-selected signals may be forwarded to a Generically-variable Logic Block (GLB) 240 for processing. GLB result signals may then be coupled to one or both of a Block output switch matrix (B-OSM) 250 and a longlines OSM 280. The OSM's can selectively route such signals to respective general and specialized interconnect resources. (See corresponding OSM's 450 and 480 in FIG. 4C.)

Among the output couplings of the OSM's there is a first bus 262 which connects to a Doubles-driving section of a Duo-Deca switchbox 260. Another of these couplings is a second bus 264 which connects to a Decas-driving section of the DuoDeca switchbox 260. One possible routing of a GLB result signal is that of passing out from bus 262, moving through the duo-deca switchbox 260, and to the Right Double tap point tp2.4 via path 222b. The result signal may then be conveyed by 2×RL line 203 to either one or both of processing nodes 213 and 214 for further processing. Another possible routing of the same or another GLB result signal is from bus 262, through the duo-deca switchbox 260, and to the Left Double tap point tp2.3 via path 222a. The result signal may then be conveyed by 2×RL line 202 to either one or both of nodes 211 and 212 for further processing.

Yet another possible routing of the same or different result signals is from the Block OSM, through bus 264, through the Decas-driving section of switchbox 260, and to a North (N) tap point tp10.N via Deca-drive buffer 265. This can be done without consuming a local 2×RL line. The buffered result signal may then be conveyed by the Northerly-extending 10×RL line (only partly shown) to one or more, farther spaced away processing/routing nodes and associated 2×RL lines. Similarly, node 218 can send an Eastwardly-heading signal from its internal East Deca drive buffer (not shown, but understood to be the counterpart of buffer 268) so that the buffered signal hops through Double-Reach Length line 201 to descend out from sparse tap points, tp10.2 and/or tp10.3 for further routing and/or processing by respective nodes 210 and 219. The respective output signals which are "elevated" into the adjacent tap point of the corresponding 10×RL line for longer-haul hopping to a spaced away, next tap point on the 10×RL line and/or for farther away destinations, do not need to consume a local 2×RL line. Thus, the local 2×RL lines (the local "streets") may be used for simultaneously carrying other signals. Although the "Deca-reach" name of line 201 implies for one embodiment, a span length extending into or through 11 nodes (see FIG. 2B), the present disclosure is not so limited. The next hierarchical, bridge level (201) above the Double-Reach Length lines (202, 203) or other-reach lines (e.g., 4×RL) could be wider if desired, say a 14×RL line instead with a respective 3 tap points or other sparse tapping. Note that the reach-length is preferably an even number, meaning that the corresponding span length number will be an odd one (reach-length number plus 1) and that therefore, there will be a middle node for each such odd-spanning general interconnect line. Preferably, there should be sparse tapping of the longer, general interconnect bridges with at least a middle tap point being provided and two end taps on each such odd-span line. Stated otherwise, except for the case of the "workhorse" 2×RL lines, the number of tap points in the other general interconnect lines should be less than the number of spanned nodes of those lines.

A possible embodiment could have 50×RL bridges with 3 tap points each in combination with 10×RL bridges and 2×RL local streets. A far-hopping signal would make a programmably navigated drop from a 50×RL bridge (not shown) down to a 10×RL bridge and then another programmably navigated drop from the 10×RL line to one or more 2×RL lines. Note for the case of the 10×RL lines illustrated in FIG. 2A that the ratio of tap points to span length is 3/11 which is at least less than 50%, and more so, closer to about 25% (3/11=27.2%). For a hypothetical 50×RL line (not shown) the ratio of tap points to span length could be 3/51 which is less than about 6%.

Because the ratio of tap points to spanned nodes is less than 100% for the "Deca-reach" (or other higher level ones of the gi-bridging lines), signals drop down from such 10×RL bridging lines (or other such higher level gi-lines) into the neighboring nodes (e.g., from 201 down into 210–219) by descending through the associated Double-reach (or other such lower level ones of the "local street" gi-lines) and then finally into the "housed" switching and/or other resources of the local node(s). More specifically, assume that node 218 had driven a result signal into 10×RL line 201 (via node 218's equivalent of buffer 268). Assume further that node 212 is to receive the result signal produced by node 218 where routing is by way of bridge line 201. The deca-transmitted signal would travel from left tap point tp10.1 to the middle tap point tp10.2 and then descend from that middle tap point tp10.2 into switchbox 260 of node 210 via line 221. Switchbox 260 would then route the descending signal by way of its Left Double-driving line 222a onto the left side, 2×RL line 202. The descending signal would then continue through the Double's middle tap point, tp2.2 into node 212. Since the descending signal is consuming the one 2×RL line: 202 anyway, if node 211 is also to receive the same descending signal, node 211 can do so via the consumed 2×RL line, 202 and its Left tap point tp2.1. Alternatively or additionally, node 211 could receive a different signal via its Left Double-accessing line 211a. In one embodiment, there are many more 2×RL lines and 10×RL lines than just the few sample ones illustrated in FIG. 2A. The 2×RL lines and 10×RL lines are staggered in horizontal and vertical interconnect channels so as to provide each processing/routing node (e.g., 210) with a rich variety of programmably navigatable signal paths for input and output signals.

If node 214 is also to receive the same result signal from node 218, where routing is by way of Deca line 201, a similar descent could be made through the appropriate 2×RL line (e.g., line 203). More specifically, the deca-transmitted signal that descends from middle tap point tp10.2 and via line 221 into switchbox 260 could be further routed by switchbox 260 to the Right Double-driving line 222b and onto 2×RL line 203. The descending signal would then continue through that Double's right tap point, tp2.6 into node 214. An aspect of the hierarchical, general interconnect architecture is therefore that the "Deca-reach" (or other such higher level one of the gi-lines) does not directly couple its Deca-conveyed signals directly into each of the adjacent processing nodes (e.g., 211–219). Instead, the deca-conveyed signal drops down through the sparse population of Deca tap points (e.g., 10.1, 10.2, 10.3) to a shorter gi-line (e.g., a Double) in the hierarchy and the descent continues until the signal reaches the lowest such type of gi-line, which in the illustrated case are the heavily-tapped, 2×RL lines. Every processing/routing node (e.g., 210–219) should connect to at least one such, shortest type of gi-line. Every longer type of gi-line should have at least 3 tap points each connecting to a node whose switchbox (260) provides routing to a shorter type of gi-line. Thus, all Deca-transmitted signals (and/or signals transmitted by other such, longer gi-lines) should be able to descend through the hierarchy and reach any desired node. Within the desired node, the deca-conveyed signal may then continue by a such as path 232a and through the doubles section of box 260 to make its way via av path such as 233 into the ISM (235) of the desired node. In one embodiment, the combination of Northerly-extending, Southerly-extending, Easterly-extending, and Westerly-extending 10×RL lines that terminate at a given node (e.g., 373 of FIG. 3A), combine with their associated 2×RL lines to define a diamond-like shaped region whose contained nodes can all be reached from the central node (e.g., 373) with a delay of no more than that associated with one Deca-Reach Length line and two Double-Reach Length lines. This will be better understood after FIG. 2B is discussed.

Another aspect of the hierarchical, general interconnect architecture relating to the "Deca-reach" (or other such higher level ones of the gi-lines) is that such longer gi-lines can route their signals from one such Deca-line to the next by way of buffered paths provided in the switchboxes (260). A deca-conveyed signal may pass laterally to a next 10×RL line as follows: coming in via an appropriate drop point (say 10.2 for purpose of illustration here) the signal moves down path 221 and into the Deca's-driving section of box 260. The signal then continues along one or more parts of path 261 for buffered output through a respective one or more of Deca-drivers such as 265 (North), 266 (South), 267 (West) and 268 (East). In one embodiment, a Deca-conveyed signal which is acquired from a middle, deca tap point (tp10.2) can be buffer driven onwards only to the end taps of orthogonally-extending Deca-lines (e.g., North and South), not to parallel wise extending Deca-lines (e.g., East and West). On the other hand, a Deca-conveyed signal which is acquired from an end, deca tap point (e.g., tp10.1) can be buffer driven to cascade further in all four directions (E, W, N, S). A PIP within the duo-deca switchbox 260, however, may allow an unbuffered result signal to be switched into the middle tap point tp10.2 of the associated Deca-line. This is so because the PIP's of one embodiment are implemented as pass-gates with programmably-selectable direction of signal flow. In other words, they can each be programmed to function as a non-connect, or as an input or as an output.

In one embodiment (see FIG. 3A), the Deca-driving buffers are designated as: (1) "Top"—for driving the terminal end of a Deca-Reach Length extending vertically to the North of the driving node; (2) "Bottom"—for driving the terminal end of a Deca-Reach Length extending vertically to the South of the driving node; (3) "Left"—for driving the terminal end of a 10×RL line extending horizontally to the West of the driving node; and (4) "Right"—for driving the terminal end of a 10×RL line extending horizontally to the East of the driving node. For each node in this particular embodiment, the T, B, L, R tap point connections are bidirectional and there are two further tap point connections: Vm and Hm which unidirectionally receive inputs from the middle tap points of respective, vertical and horizontal 10×RL lines. Because the middle tap points of Deca-Reach Length lines do not have drive buffers in this particular embodiment (FIG. 3A), the 10×RL lines can be said to be "sparsely buffered". As a result, circuit space and power consumption are further preserved beyond the fact that the 10×RL lines are "sparsely-tapped". In one variation of this scheme, a result signal can nonetheless be driven at a 2×RL driving power level onto the associated 10×RL line via the Vm or Hm tap point. This means that the middle tap point drive of the 10×RL line will have a longer propagation time during the initial elevation of the signal from a node to a middle Deca tap point. However, if the middle-injected signal is to be cascaded to further Deca-lines, it can be repowered by the end-point Deca-drive buffers (265–268).

Figure 2B:
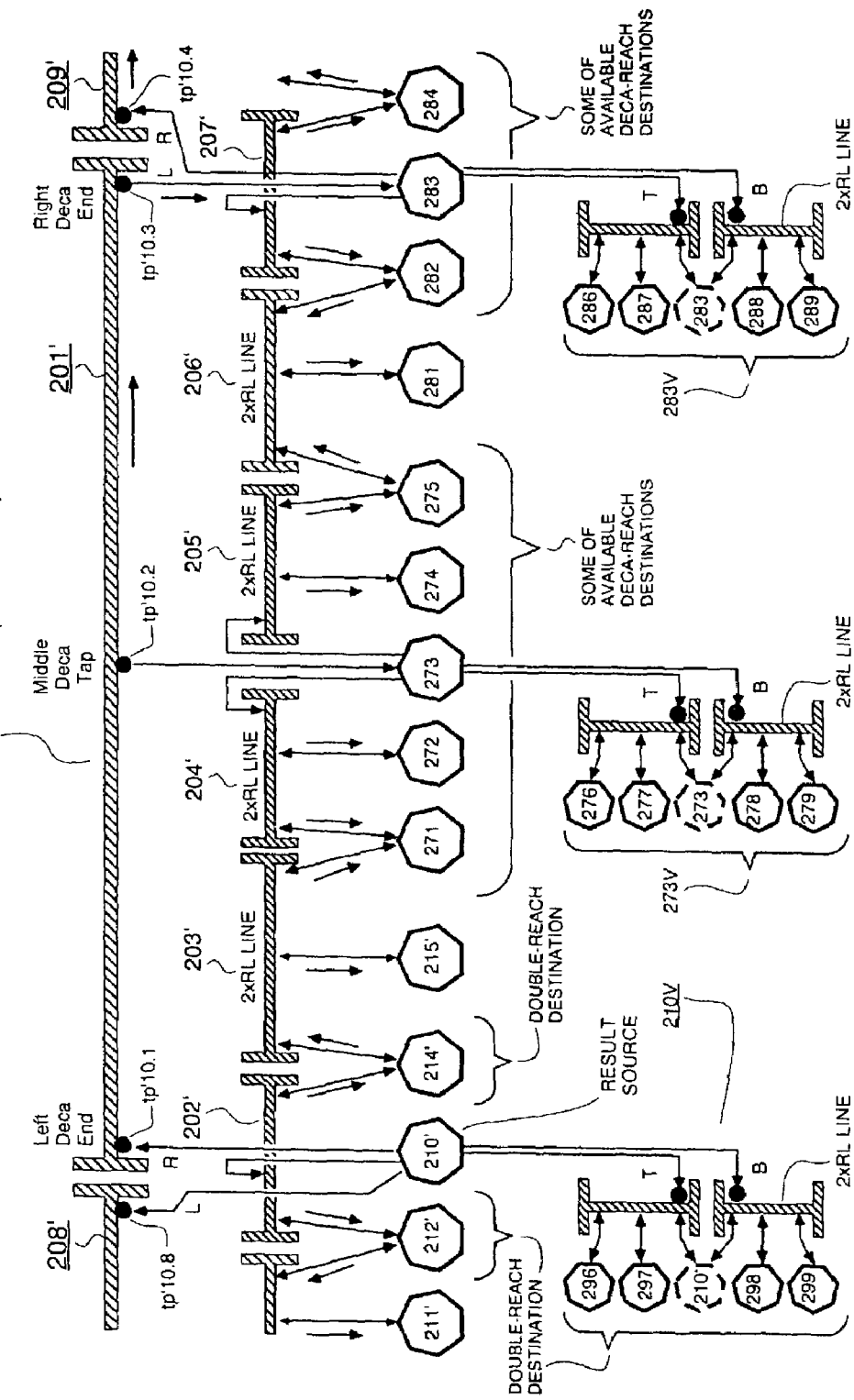
FIG. 2B illustrates a second Duo-Deca embodiment in which a each line (a 10×RL line) having a span length that extends into or through 11 and only 3 signal tap points nonetheless allows a first processing/routing node a signal which reaches at least 10 further nodes.

FIG. 2B is a schematic of an embodiment 200' which obeys the following first alignment rules: For each horizontal 10×RL line (e.g., 201'), its Left tap point (tp'10.1) connects to a spanned first node (210') which also connects to the midpoint of a horizontal first 2×RL line (202') spanning the same first node (210'). Further for each horizontal 10×RL line (e.g., 201'), its middle tap point (tp'10.2) connects to a spanned second node (273) which also connects to respective Right and Left end taps of respective second and third 2×RL lines (204', 205') which extend horizontally to span the second node (273). Yet further for each horizontal 10×RL line (e.g., 201'), its Right tap point (tp'10.3) connects to a spanned third node (283) which also connects to the midpoint of a horizontal fourth 2×RL line (207') spanning the same third node (283).

It may be seen in FIG. 2B that the above, first alignment rules allow a source node such as 210' to transmit its result signal via the 10×RL line (210') and have the signal immediately reach 10 further nodes. Tap point tp'10.2 can drop the signal into node 273, where the latter can immediately couple (using one switching action in its internal switchbox—see 260 of FIG. 2A) the signal to nodes 271–272 and 274–275 by way of 2×RL lines 204' and 205'. Tap point tp'10.3 can drop the signal into node 283, where the latter can immediately couple (using one switching action in its internal switchbox) the signal to nodes 282 and 284 by way of 2×RL line 207'. Additionally, source node 210' can couple the same signal to nodes 212' and 214' by way of horizontal 2×RL line 202'. Thus, by consuming the one 10×RL line 201' and the four horizontal 2×RL lines: 202', 204', 205'and 207'; the place-and-route software can route the signal from source node 210' to ten further nodes of the same horizontal row, namely, 212'; 214', 271–275 and 282–284.

Additionally, and more importantly, even nodes such as 215' that are missed by the immediate reach of Deca-tap accessed Doubles like 202' and 204' can be reached by cascading the signal through just one more Double, like 203'. The flow could be from tap point tp'10.1, through node 210', along Double 202' and then through node 214' to reach 215' via Double 203'. Alternatively, the flow could be from tap point tp'10.2, through node 273, along Double 204' and then through node 271 to reach 215' via Double 203'. So there are at least two paths. The delay is no more than that of one Deca (201') and two Doubles (e.g., 202' and 203'). Thus all 10 of the further nodes spanned by a Deca-line can be reached with a delay of no more than that of one Deca and two Doubles.

Moreover, at least all 11 of the spanned nodes (e.g., 210' plus 214'–215', 271–275, 281–283) of a given 10×RL line (e.g., 201') can be reached by a signal carried on that given Deca-line by consuming no more than six (6) 2×RL lines (e.g., 202'–207') for bringing the deca-carried signal down from the elevated-avenue level to the "street" level for input into the at least all 11 nodes. If one of the spanned nodes (e.g., 210') is the source of the deca-carried signal, then no more than five (5) 2×RL lines (e.g., 203'–207') need be consumed for reaching 11 further nodes associated with the consumed Deca-line (201') where the eleventh extra node (284) is reachable because it is spanned by the end Double-line (207').

In one embodiment, each set of Northerly-extending, Southerly-extending, Easterly-extending, and Westerly-extending 10×RL lines that terminate at a given node (e.g., 373 of FIG. 3A), can combine with their associated 2×RL lines to define a diamond-like shaped, two-dimensional region whose contained nodes can each be reached from the central node (e.g., 373) with a delay of no more than that associated with one Deca-Reach Length line and three (3) Double-Reach Length lines. (The reason it is three 2×RL lines rather than two is because the reach is now of a two-dimensional nature rather than of a one dimensional nature.) If cascading to yet one more set of Deca-lines is allowed in one or more of the N, E, W, S directions, then a yet larger diamond shape (with slightly concave sides), or a subsection of such a concentrically larger diamond region, is defined within which the maximum delay for reaching any contained node via general interconnect is two Deca-Reach Length lines and three Double-Reach Length lines (this of course, including the delay of moving the signal through the associated PIP's in the node switchboxes). The concentric expansion of the delay-assured, 2-dimensional region may continue as may be desired and allowable within the finite confines of the FPGA array. Place-and-route software is given the ability to relatively reposition within the FPGA array, delay constrained design sections which take advantage of such reach-continuous diamond shaped, general interconnect resources. Because the diamond shape is symmetrical about 90 degree intervals, the place-and-route software may make 90 degree relative rotations as well as horizontal and vertical, relative translations of the central node and its gireached destination nodes when trying to find an appropriate floor mapping for the overall circuit design that is to be programmably implemented by the FPGA.

Note that the translation and rotation option does not have to involve the whole diamond shaped region. It is available for destination nodes within any other-wise shaped subsection of the diamond-like shaped region since any subset of destination nodes contained within the diamond-like shaped region are reachable via general interconnect with the ceiling delay of no more than a ceiling amount of one Deca-Reach Length line and three (3) Double-Reach Length lines within the first of the concentrically-expandable diamond shapes. Stated otherwise, signal propagation timing symmetry may be provided by the general interconnect structure so that, despite rotation about the central node or other relocation of the destination nodes relative to the central node, as long as the destination nodes remain within the concentrically-expandable diamond shape, it can be guaranteed that the signal propagation time need not exceed the predefined optimal ceiling value of the diamond shape if just the general interconnect is used for interconnecting the source to destination nodes of a corresponding circuit design section, where the design section is to be programmably-implemented inside the diamond shape region of the FPGA. Because the diamond shape region repeats in symmetrical fashion essentially about all core nodes of the FPGA, a given circuit design section can be relatively translated and/or rotated within the-core area of the FPGA without exceeding the optimal ceiling value of the diamond shape. (The ceiling value is not the maximum general interconnect delay within the diamond shape. Instead, it is the minimum for reaching any node within the diamond shape while using just the general interconnect. The place-and-route software is free to use other types of interconnect such as the direct-connect structures in combination with the general interconnect.)

In addition to, or as an alternative to relative placement of circuit nodes within the concentric, diamond-shaped regions, the place-and-route software may elect to horizontally cascade a Deca-carried signal from a first 10×RL line such as 201' to one or a plurality of further 10×RL lines such as 208' and 209'. This may be done for example by using the Right Deca driver in node 283 for repowering and injecting the signal obtained from tap point tp'10.3 into tap point tp'10.4 and/or it may be done by using the Left Deca driver in node 210' for repowering and injecting the signal obtained from tap point tp'10.1 into tap point tp'10.8. If a particular signal is to be broadcast to many nodes in a row or column of the FPGA array rather than being programmably navigated to a specific few nodes with one or a few Deca-hops, then it may be advisable to use longlines (MaxRL lines) or Global lines rather then the hierarchical general interconnect structure.

Noting again that nodes 211', 215' and 281 of FIG. 2B are not immediately reachable by the combination of illustrated Deca-Reach Length line 201' and a single 2×RL line; an alternate solution for reaching such once-removed nodes (211', 215' and 281) is to use other 10×RL lines of the appropriate interconnect channel. The interconnect channel should have additional 10×RL lines (not shown—see FIG. 7) which are staggered relative to line 201' and can reach nodes such as 215' and 281 more directly. The other solution, as already explained, is to use intervening nodes for cascading the signal sourced from node 210' through one or more further 2×RL lines to reach the skipped nodes (211', 215' and 281). For example, once node 273 routes the source signal from tap point tp'10.2 to Double-line 204', interconnect routing resources within intervening node 275 may be used to continue the signal onto 2×RL line 206' for acquisition by skipped-over node 281. Node 282 may be used to continue the signal onto 2×RL line 207' and so forth.

The above has been mostly a one-dimensional look at the signal routing capabilities of the 10×RL and 2×RL lines. However, such hierarchical general interconnect lines should extend two—dimensionally across the FPGA, such as in respective horizontal interconnect channels (HIC's) and vertical interconnect channels (VIC's—see FIG. 4A). FIG. 2B illustrates an additional interconnect rule that may be followed in an embodiment: For each 10×RL line (e.g., 201') extending in a first direction (e.g., horizontally), its Left, Middle and Right tap points (tp'10.1, 10.2, 10.3) each connects to a respectively spanned node (210', 273, 283) which also connects to the end taps of orthogonally extending 2×RL lines. More specifically, processing/routing node 210' will have Top and Bottom 2×RL lines (shown at 210V) which extend vertically above and below that node so as to programmably couple node 210' to further nodes in the same column. The illustration shows nodes 296, 297 schematically situated above 210' (drawn in phantom at 210V) and nodes 298, 299 schematically situated below 210'. Similarly, the illustration shows nodes 276, 277 schematically situated above node 273 (drawn in phantom at 273V) and nodes 278, 279 schematically situated below 283. And furthermore, the illustration shows nodes 286, 287 schematically situated above node 283 (drawn in phantom at 283V) and nodes 288, 289 schematically situated below node 283. Groups 273V and 283V represent a different set of 10 further nodes that source node 210' can reach by using the 2×RL line 201'. Although fully not shown because of space limitations in the drawing, it is to be understood that group 273V has a vertically extending 10×RL line associated with it just as horizontal 2×RL lines 204' and 205' have the horizontally extending 10×RL line, 201' associated with them. The same will of course be true for groups 210V and 283V.

Figure 2C:
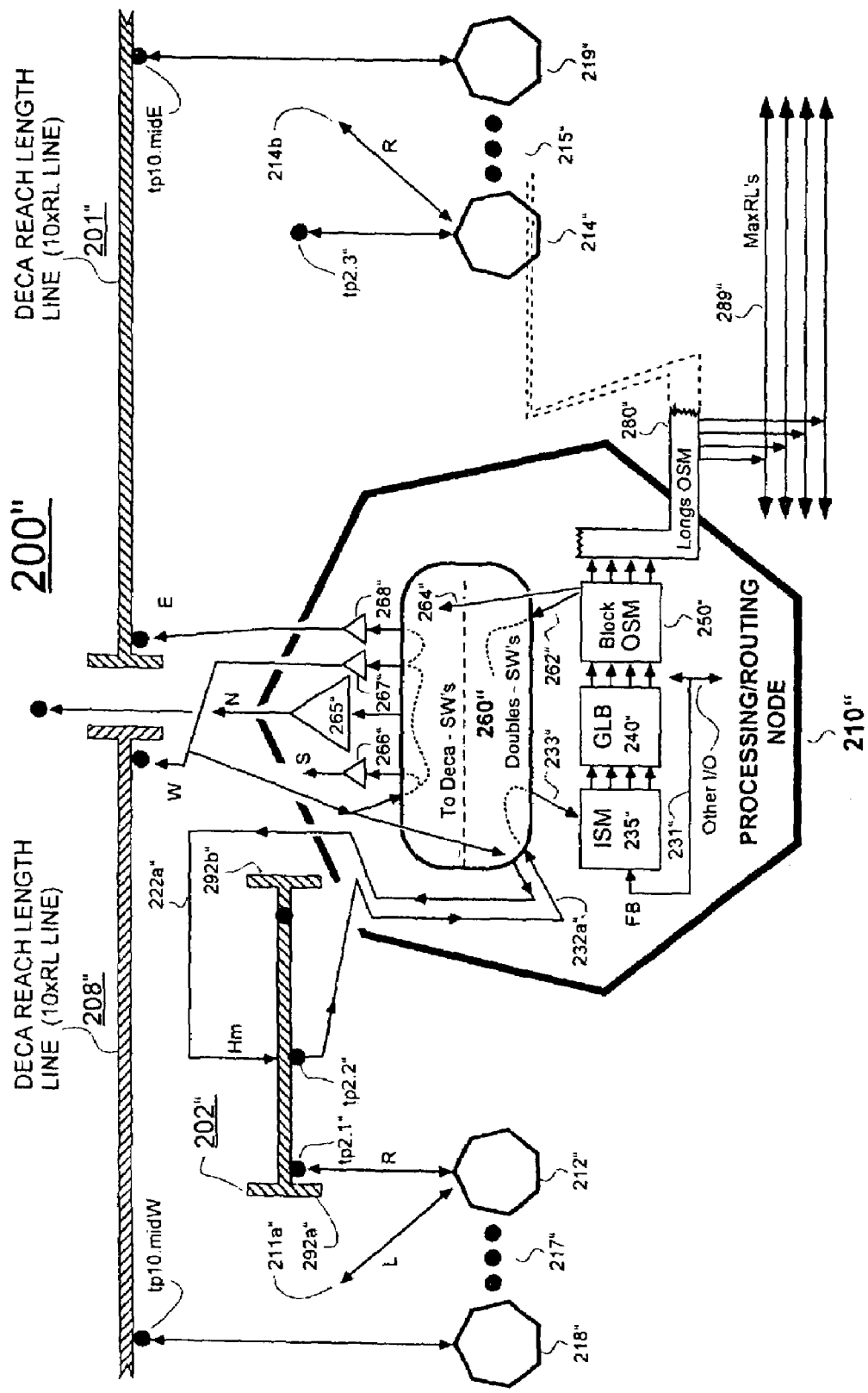
FIG. 2C shows in more detail the neighborhood of a node that is spanned by two, cascadable Deca-reach lines.

FIG. 2C provides a closer look at a node 210" which connects via Deca-driving buffers such as 267" and 268" to the terminal ends of respective, Left and Right Deca-Reach Length lines 208" and 201". Top driver 265" connects to an unseen terminal end of a Top 10×RL line and Bottom driver 266" connects to an unseen terminal end of a Bottom 10×RL line. Tap point tp2.3" (node 214") belongs to the right end of 2×RL line 202". However, to avoid illustrative clutter, 2×RL line 202" is shown on the left side of node 210". Other aspects of FIG. 2C are self explanatory.

FIG. 3A schematically shows a two-dimensional relation between 10×RL lines in an embodiment 300 which could correspond with 200' of FIG. 2B. Each vertical interconnect channel (VIC) and horizontal interconnect channel (HIC) will typically have many 10×RL lines and 2×RL lines. See for example FIG. 4A. In FIG. 3A, the vertical Deca-Reach Length lines of node 373 are in the same VIC but are drawn spaced apart for purpose of clearer illustration. Similarly, the horizontal Deca-Reach Length lines of node 373 are in the same HIC but are drawn spaced apart for clarity sake. Unidirectional input connections are provided into node 373 from middle tap points Hm and Vm of the respectively illustrated 10×RL lines. Bidirectional input/output connections are further provided between node 373 and the respectively illustrated T (Top), B (Bottom), L (Left) and R (Right) end taps of the illustrated 10×RL lines that respectively extend away upwardly (T), downwardly (B), to the left (L) and to the right (R) away from node 373.

Various different permutations of routing options (navigation rules) could be provided by the switchbox (not shown) inside node 373. One particular such navigation rule is shown in the legend denoted as "To-Deca Routing Rules of Node 37x" and is understood to apply to all the nodes of the corresponding embodiment. Besides being able to receive an input signal and route it via one or more of the 2×RL lines (not shown) of node 373, a "T" line can output a buffered signal that has been obtained from a programmably selected one of the following elements of node 373: its B line, its L line, its R line, its Hm line and its internal Block OSM (BOSM). The BOSM supplies a result signal generated by processing in the GLB (not shown, see FIG. 2A) of the node. Note that there is no routing in this embodiment from the Vm line to the vertically extending 10×RL line of the T tap. That means that a 10×RL driving buffer will not be wasted to merely to move a vertically propagating signal from one vertical line to a parallel and adjacent other 10×RL line in the same VIC. The "B" line of node 373 can similarly output a buffered signal obtained from 5 of the 6 possible sources, where the excluded source is again the Vm input. The "L" line of node 373 can similarly output a buffered signal obtained from 5 of the 6 possible sources, where the excluded source is the Hm input. And the "R" line of node 373 can similarly output a buffered signal obtained from 5 of the 6 possible sources, where the excluded source is the Hm input. Thus a middle tap input (Hm or Vm) can be used for providing a change of direction for the signal carried through its tap point, not for continuing the signal in a parallel path.

FIG. 3B schematically shows a two-dimensional relation between 2×RL lines in an embodiment 300' which could correspond with 200' of FIG. 2B and 300 of FIG. 3A. Various different permutations of routing options (navigation rules) could be provided by the switchbox (not shown) inside node 373'. One particular such navigation rule is shown in the legend denoted as "Double-To-Double Routing Rules of Node 37x" and is understood to apply to all the nodes of the corresponding embodiment. Unlike the 10×RL tapping lines of FIG. 3A, all of the T, B, L, R, Hm and Vm tap lines in FIG. 3B are bidirectional. A first routing rule used in one embodiment is that the middle tap (Vm or Hm) of each 2×RL line only routably connects (via the switchbox inside node 373') with end taps of orthogonal other 2×RL lines of the same node 373', not with parallel other 2×RL lines of the same node 373'. So, when the Hm and/or Vm taps are used as inputs they can only be used to change the routing direction of the received signal.

A second routing rule which may be used in an embodiment 300' of FIG. 3B is that end taps of the 2×RL lines may be used for routably coupling a signal to end taps of the other 2×RL lines of the node irrespective of whether those other 2×RL lines are orthogonal or parallel to the source line. The end taps of the 2×RL lines may further be used for routably coupling a signal to the midtaps of the other 2×RL lines of the node which run orthogonally, but not to the midtaps of those 2×RL lines which run parallel to the source 2×RL line.

FIG. 4A is a block diagram of an interconnect structure organized in accordance with the present disclosure. The illustrated tiling arrangement 400 may be used for arranging Generically-variable Logic Blocks (GLB's) such as the illustrated blocks 410–460 relative to one another and relative to corresponding ISM blocks 414–464 and relative to corresponding switchboxes (SB's) 416–466 of the neighboring interconnect. The tiling arrangement 400 is taken at a macroscopic level of view and is to be understood as not being to scale. In one embodiment, the circuits of the ISM's (e.g., 414) and SB's (e.g., 416) are intermingled in an L-shaped region overlapping with the intersecting vertical and horizontal interconnect lines and this L-shaped region (not shown) is substantially larger in circuit area than the area occupied by the circuitry of the corresponding GLB (e.g., 410). It is to be understood that many variations may be possible for: (1) what constitutes the respective GLB's 410, 420, etc.; (2) what constitutes the respective ISM blocks 414, 424, etc.; (3) what constitutes the respective SB's 416, 426, etc., and (4) what constitutes the respective neighboring interconnect (e.g., Vertical Interconnect Channel {VIC} 401 and Horizontal Interconnect Channel {HIC} 402 of neighboring GLB 420). As such, the tiled layout 400 of FIG. 4A is to be taken as nonlimiting with respect to constituent components shown therein and descriptions herein of examples of such constituent components are to be taken as nonlimiting with respect to the illustrated tiling arrangement 400 of FIG. 4A.

Within the illustrated VIC 401, elements 401a, 401b, 401x, 401g and 401f respectively refer to: (a) corresponding 10×RL lines (deca-reach length lines), (b) corresponding 2×RL lines (duo-reach length lines), (x) corresponding MaxRL lines (maximum-reach length unidirectional lines), (g) global reach lines, and (f) local, intra-GLB feedback lines (FB's) and dedicated, inter-GLB direct-connect lines (DC's). Elements 402a, 402b, and 402lx of the illustrated HIC 402 respectively refer according to their suffixes to same kinds of lines that instead extend horizontally. As can be seen, the horizontal duo's and longs (402b and 402x) have conductors that define adjacent interconnect lines (AIL's) of ISM blocks such as 424. The vertical duo's and longs (401b and 401x) also have conductors that define AIL's of respective ISM blocks such as 424. Horizontal and vertical deca's (10×RL lines in groups 401a and 402a) do not participate in this embodiment 400 as AIL's of any ISM block such as 424. Instead, the switchboxes (e.g., SB 424) and associated 2×RL lines must be used in this embodiment as highway entrance and exit ramps (metaphorically speaking) for moving signals out of the 10×RL lines by way of local roads (metaphorically speaking) that are defined by corresponding 2×RL lines (e.g., 401b, 402b) extending into same ones of the duo-deca switchboxes (e.g., 426). See also the duo-deca switchbox 460' of FIG. 4C.

As can be further seen in FIG. 4A, besides the 2×RL lines and the MaxRL lines, the local FB's and DC's (401f) as well as the global-reach conductors (401g) define additional, adjacent interconnect lines (AIL's) of ISM blocks such as 424. Signals from the various AIL's of a given ISM block can be selectively acquired by the ISM block (e.g., 424) and fed into the corresponding GLB (e.g., 420) for processing therein. GLB outputs may then returned to the AIL's for local continuation (e.g., via the FB's and/or DC's) and/or for general continuation (e.g., via the local duo-deca switchbox, and then through the 2×RL and/or 10×RL lines) and/or long distance continuation (e.g., via the MaxRL lines). The horizontal and vertical, longlines output switch matrices (LOSM's) are organized to service respective horizontal and vertical sequences of four GLB's each. Part of a vertical one of such sequences of GLB's is shown in FIG. 4A as dashed box 481. Part of a horizontal one of such sequences of 4 GLB's is shown in FIG. 4A as dashed box 482. Longline drive capability per GLB is asymmetrical in the illustrated embodiment 400, with each vertical LOSM (481) contributing just two outputs (e.g., W0' and Y0' of FIG. 2A) from each of its corresponding 4 GLB's to the adjacent, vertical MaxRL lines, and with each horizontal LOSM (482) contributing four outputs (e.g., W0', X0', Y0' and Z0' of FIG. 4C) from each of its corresponding 4 GLB's to the adjacent, horizontal MaxRL lines. Thus each vertical LOSM (481) has 8 tristate drivers (only 4 indicated in FIG. 4A) driving a corresponding 8 longlines in the adjacent vertical channel while each horizontal LOSM (482) has 16 tristate drivers (only 8 indicated in FIG. 4A) driving a corresponding 16 longlines in the adjacent horizontal channel. The less numerous, vertical MaxRL lines (401x) are preferably used for broadcasting control signals along columns of GLB's while the more numerous, horizontal MaxRL lines (402x) are preferably used for broadcasting data-word signals along rows of GLB's. However, although it may, this bias does not have be used to guide decisions of the place-and-route software.

FIG. 4B shows further details of an embodiment 400' corresponding to that of FIG. 4A. A vertical 2×RL line (433) is shown within VIC 401' as being a continuous conductor that extends a sufficient length to just reach from switchbox

460b (SwBK-B) to two closest ones and vertically adjacent switchboxes, 460a (SwBK-A) and 460c (SwBK-C). Because of the placement of the switchboxes in corners of their respective, GLB logic tiles, the 2×RL lines need not be longer than about the sum of two times the vertical side dimension of a given GLB tile (490a, 490b, etc.) plus the widths of two channels. The three GLB's (e.g., 491a, 491b, 491c) serviced by a given 2×RL line may lie adjacent to one another in a same row of GLB's or a same column of GLB's. It is seen from FIG. 4B that each corresponding 2×RL line (e.g., 433) allows any GLB (e.g., 491a) to talk, through its respective switchblock (e.g., 460a) to any two other GLB's (e.g., 491b, 491c) that lie adjacent to the given 2×RL line. The term 'logic tile' refers to the programmable parts of a full tile, in other words it does not include the nonprogrammable conductors of the tile-to-tile interconnect mesh. The reason, 'logic tile' is used is so that its aspects can be discussed separately from a 'full tile', where the latter does include hypothetically-sliced parts of the tile-to-tile interconnect mesh which extends through the full tiles.

Referring briefly to FIG. 4C, although it is not fully shown therein, each of the registered, or register-bypassing, W0', X0', Y0' and Z0' signal may be coupled by way of the corresponding H&V longline OSM's 480" to any one or more of eight (8) vertical, MaxRL lines and/or any one or more of sixteen (16) horizontal, MaxRL lines. In FIG. 4B, the vertical (V) longline OSM is understood to be formed by conjoined sections 481a of the three illustrated tiles, 490a–490c as well as by one further conjoined section (481a, not shown) of 1 further tile which is vertically aligned to tiles 490a–490c. Each of the 4 conjoined sections 481a will each be coupled via tristate drivers (not shown) to two respective ones of a total of 8 MaxRL lines in VIC 401'. Any GLB (e.g., 491a) can output up to two of its result signals to any two of the 8 vertical MaxRL lines associated with conjoined sections 481a.

For the horizontal row in which illustrated tile 490a (GLB-A) resides, there will again be four conjoined versions of the, illustrated horizontal (H) longline OSM section 482a, each coupled via 4 respective tristate drivers (not shown) to four respective ones of a total of 16 MaxRL lines in HIC 402'. Any-GLB (e.g., 491a) can output up to four of its result signals to any desired four of the 16 horizontal MaxRL lines associated with conjoined, horizontal-longlines OSM sections 482a. Each MaxRL line (e.g., 498) may couple bidirectionally and on a tristated-basis, via an associated Input/Output Block (e.g., IOB 482) with a package terminal or pin 483. A package-external signal may therefore be imported into the FPGA from pin 483 and along MaxRL line 498 to any one or more of the GLB's (e.g., 491b) lying adjacent to that longline. The externally-sourced signal may then be fedthrough the ISM-1 and ISM-2 stages of the one or more longline-adjacent GLB's to state-storing registers (e.g., 408a of FIG. 4C) of those GLB's. From there, the externally-sourced, and internally-synchronized signal may be forwarded by way of a vertical MaxRL line in VIC 401' and/or a 10×RL line and/or a 2×RL line for further processing.

The illustrated longlines (MaxRL lines, 401x, 420x in FIG. 4A), double-lines (2×RL lines 401b, 420b in FIG. 4A), along with other kinds of illustrated lines: Local FB's 401f, Regional DC's—also 401f, and global-reach length lines (GRL's 401g in FIG. 4A), feed into the user-programmable, first Input Switch Matrix stage (ISM-1) or second Input Switch Matrix stage (ISM-2) as shown in FIGS. 4B and 4C. It is seen in FIG. 4B, that a global-reach-carried signal can be a phase-loop-locked clock signal produced by PLL 492 and derived from an external signal input on package terminal 493 or a direct clock or another kind of signal input by way of the illustrated, programmably-activated, PLL-bypass path 494. Note that the global-reach length lines (GRL's) can feed directly into the ISM-2 stages while the other lines (except deca-reach lines) generally feed first into the ISM-1 stages for initial selection of their respective signals before those signals are forwarded through the ISM-2 stages of their corresponding GLB's. In one embodiment, each vertical inter/intra-connect channel (e.g., VIC 401 of FIG. 4A) comprises 40 10×RL lines, 32 2×RL lines, 8 MaxRL lines, 4 local feedback lines, 14 direct-connect lines, and 9 global-reach lines. Each horizontal interconnect channel (e.g., HIC 402 of FIG. 4A) comprises 40 10×RL lines, 32 2×RL lines, and 16 MaxRL lines. Neither of VIC 401 and HIC 402 contains any single-length reach lines which are limited to coupling together just two adjacent switchboxes (see by rough analogy, the 1×CL lines of FIG. 1).

In FIG. 4B it is seen that each GLB tile (e.g., 490b) includes a Block Output Switch Matrix (BOSM) for selectively routing the GLB output signals to the local switchbox (e.g., 460b) for further routing to the adjacent interconnect lines (AIL's such as 2×RL lines, 10×RL lines, and MaxRL lines). Each GLB tile (e.g., 490b) further includes a direct-connect sourcing node (e.g., DCB) which directly connects to 14 nodes in the ISM-1 stages of 8 neighboring GLB-tiles. One specific, DC sourcing pattern which may be used is shown at 490d in FIG. 4B. GLB tile 490b is understood to lie in a row, "B" of GLB-tiles that further has at least one other GLB-tile (B−1) to the left of the DC sourcing tile (B+0) and that further has at least one other GLB-tile (B+1) to the right of the DC sourcing tile (B+0). GLB tile "A" (or "A+0", as it may alternatively be named) is situated directly above the DC sourcing tile (B+0). GLB tile "C" is situated directly below the DC sourcing tile (B+0) in the same column with GLB tile "A". GLB tiles "A−1" and "A+1" straddle to the left and right of tile "A". GLB tiles "C−1" and "C+1" straddle to the left and right of GLB tile "C". DC sourcing region, DCB extends by way of the illustrated, 14 conductors to 14, DC-receiving nodes in the 8 tiles surrounding the sourcing tile. Because of symmetry, the illustrated pattern 490d may also be used to schematically represent the pattern of DC inputs that each central GLB-tile sees, with an exception to the latter being that the 14 conductors are presented individually to the ISM-1 stage of the corresponding central GLB-tile for selective acquisition and forwarding into the corresponding ISM-2 stage.

FIG. 4C, shows a particular embodiment 400" of internals of a processing/routing node in accordance with the present disclosure. Some of the more notable features include are the following:

(a) The provision of plural, simultaneously-accessible registers (e.g., 408a, 409a) for each function-spawning LUT (e.g., where each fs-LUT such as 405A is also referred to herein on occasion as a base lookup table);

(b) The provision of primary feedthrough lines (e.g., FTa–FTd) that can transmit locally acquired input signals (e.g., 435) to the plural state-storing registers (e.g., registers 408a–409d) and/or that can transmit such locally acquired input signals from virtually any kind of adjacent interconnect line (e.g., MaxRL, DC) or intra-connect line (e.g., FB) to virtually any kind of other adjacent interconnect line (e.g., 2×RL, DC, MaxRL) or intra-connect line (e.g., FB);

(c) The provision of register-feeding multiplexers (e.g., 407a) that can select from amongst LUT output signals (e.g., $f_a(4T)$), and/or the signals of the primary feedthrough lines (e.g., FTa) and/or other signals (e.g., 406a) for feeding to data inputs of the plural state-storing registers or, if such registers are bypassed, for feeding to output routing structures (e.g., BOSM, H/V-LOSM, DC, FB) of the bypassed registers;

(d) The provision of local feedback lines (431, FBa–FBd) that can feed back registered signals—or unregistered signals, if the particular register is programmably bypassed—where the so-fedback signals (431) may define part of a set of selectable signals which may be locally acquired for further processing by a corresponding Generic Logic Block (GLB) 401 that generates the local feedback signals; and (e) The provision of a secondary input switch matrix stage 440" (ISM-2), where the secondary ISM stage can provide at least one of the functions of:

(e.1) selectively replicating a given address signal for submission to each of corresponding LUT address inputs of the respective fs-LUT's (405A–405D) in the GLB 401", so that, for example, the following sets of input term equalities may be programmably established: (1) a0=b0=c0=d0; (2) a1=b1=c1=d1; (3) a2=b2=c2=d2; and (4) a3=b3=c3=d3;

(e.2) selectively replicating a given address signal for submission to each of corresponding feedthrough lines so that, for example, the following feedthrough equality condition may be programmably established: FTa=FTb=FTc=FTd; and (e.3) being able to equivalently route groups of input term signals and feedthroughs to any one or more of the illustrated W, X, Y and Z Configurable Building Blocks (e.g., CBB 402) so that bit significance or other nibble-wide ordering requirements can be accommodated as desired and/or so that special interconnect (e.g., DC) or intra-connect (e.g., FB) reaching aspects of specific ones of the W, X, Y and Z CBB's may be taken advantage of.

Since the primary focus of this disclosure is the general interconnect, only a few highlights of FIG. 4C will be mentioned. Basically, in association with each GLB such as 401", there are provided: a primary input switch matrix 430" (ISM-1), a secondary input switch matrix 440" (ISM-2), a block output switch matrix 450" (BOSM) and an interconnect switchbox 460". Longline output switch matrices 480" may be associated with respective groups of GLB's. Although the Longline Output Switch Matrices (H&V LOSM's) 480" are shown to be conceptually separate from the BOSM 450" (Block Output Switch Matrix) in FIG. 4C, it is to be understood that the BOSM and LOSM structures can be physically integrated to define a general OSM (Output Switch Matrix) structure and that slices of such an integrated OSM can be respectively associated with respective GLB's (only one shown in FIG. 4C: GLB 401"). Moreover, even though the vertical and horizontal longlines (MaxRL lines) are shown to be merging into a combined, H&V LOSM's structure 480"; in one embodiment the HLOSM's are separate from the VLOSM's. The connectivity of each GLB to both the HLOSM's and the VLOSM's remains though.

Element 411 represents a respective one or a set of buffers for driving a W1 result signal of GLB 401" respectively to a direct connect line, DCa and/or to a local feedback line, FBa, as well as forwarding the W1 signal to the GLB's associated Block Output Switch Matrix (BOSM) 450". In one embodiment, lines DCa and FBa are parts of a continuous, single conductor that is driven by a single line-driving buffer.

As seen in FIG. 4C, FB and DC carried signals are not distributed through the associated, general-OSM (450" combined with slice of 480") of GLB 401". Instead, the FB-signal carrying feedback lines, FBa–FBd connect by way of first bus 431 directly to a corresponding four inputs of a first-stage input switch matrix 430 (ISM-1) associated with GLB 401". Fourteen direct connect lines from a neighboring set of other GLB's connect by way of bus 434 to a corresponding fourteen other inputs of the first-stage input switch matrix 430. Direct connect output lines DCa–DCd of GLB 401" do not connect back to its own ISM-1 (430), but rather they each extend to corresponding ones of the neighboring, other GLB's. Accordingly, connection symbol 432 is drawn as a dashed line to indicate that DCd is not coupling the Z1 signal (node 415) of GLB 401" directly back to its own first ISM-1 430" but rather that a corresponding buffer element 217''' in another GLB 201''' (not shown) is supplying its respective Z1' signal by way of bus 434 to ISM-1.

It may be seen that a highly-flexible, building block (a CBB or Configurable Building Block 402") can be provided by the combination of each lookup unit (e.g., 405A) and its associated plurality of state-storing registers (e.g., 408a, 409a) and the interposed, registers-feeding means (e.g., 407a). That CBB structure 402" may be augmented with the inclusion therein of a primary feedthrough line (FTa) feeding into the registers-feeding means and/or with the inclusion therein of other signal lines (e.g., 406a) feeding into the registers-feeding means (e.g., 407a). The functionality of that CBB structure 402" may also be augmented with the provision of a multi-stage, input-signals acquiring means (e.g., 430"–440") which selectively supplies the CBB structure 402" with corresponding input term signals (e.g., a0–a3 and FTa).

It may be understood from FIG. 4C that one or more general input signals may be acquired by the ISM-1 stage associated with a particular GLB from the Adjacent Interconnect Lines (AIL's) of that GLB. The AIL's of each GLB/ISM combination may include lines such as those of a first illustrated bus 433 (horizontal and vertical duo-reach lines or 2×RL's), a second illustrated bus 438 (horizontal and vertical, maximum-unidirectional-reach lines with tristate capability, or MaxRL's) and a third illustrated bus 439 (global clock and/or signal lines, GLO×RL's). It is to be understood from FIG. 4C that the illustrated ISM/GLB/OSM combination (more specifically the combination of ISM stages 430"/440", GLB 401" and OSM 450"/480") constitutes part of a repeatable arrangement 400" that may be repeated in tiled form (see also FIG. 4A) within an FPGA provided on a monolithically integrated circuit chip or another such circuit support means. Some amount of braiding (e.g., among the 2×RL lines) may be provided between tiles to avoid signal collision (e.g., the place-and-route software trying to get 2 different signals onto a same numbered 2×RL line of two adjacent tiles). Such braiding is shown in FIG. 6.

Selected ones of the acquirable first-stage signals (431–439) of FIG. 4C may be fed by way of the inter-stage bus 435 into ISM-2 (440"), and from there, by way of any of feedthrough lines FTa–FTd, and thereafter by way of corresponding registers-feeding multiplexers 407a–407d to one or more of the state-storing registers {408a, 409a} through {408d, 409d} associated with the feedthrough lines FTa–FTd. If the so-fedthrough signals (e.g., FTA, FTb, etc.) are stored in respective ones of FB-driving registers

409a–409d, then the corresponding feedback lines, FBa–FBd may be used to quickly (and/or low-power wise) couple the registered signals back, by way of bus 431 into ISM-1 (430") and from there, by way of the ISM interstage bus 435 to serve as one or more respective inputs, A0–d3 of the function-spawning LUT's 405A–405D. The corresponding, LUT result signal (e.g., $f_a(4T)$) may then be programmably passed through a registers-feeding multiplexer (e.g., 407a) to an unconsumed register (e.g., 408a—if available) for storage therein. In one embodiment, signals on the MaxRL lines (438) must be passed via feedthroughs if they are to be copied onto other forms of interconnect.

Referring still to FIG. 4C, the so-formed and optionally stored result signal (e.g., the signal, $f_{a-d}(4T)$, that is ultimately generated on terminal W0, which signal may be output from register 408a or from multiplexer means 407a if a register-bypass mode is used) can then be coupled to the general, GLB/IOB interconnect of the FPGA by way of the logic block's general OSM—where the latter is defined by one or both of the illustrated, Block Output Switch Matrix (BOSM 450") and the horizontal and vertical Longlines Output Switch Matrices (HLOSM, VLOSM—collectively shown as 480"). Line W0', incidentally, is equivalent to node W0. The outputs from either one or both of the W0/W0' terminal (410") and the W1 terminal (411) can be applied equivalently to the BOSM 450" for subsequent coupling to the general interconnect of the FPGA. (The latter, general interconnect includes the hierarchically structured "duo"-bus 433 and the "deca"-bus 437, both of which have already been discussed at length.)

In the illustrated embodiment, the Block OSM 450" (BOSM) feeds into the main duo-deca switchbox 460". The latter switchbox 460" can be user-programmed to route the BOSM's output signals 462 and 464 respectively onto the adjacent duo-reach general interconnect lines (2×RL's) 433 and onto deca-reach general interconnect lines (10×RL's) 437. Additionally, the duo-deca switchbox 460" can programmably route signals between various ones of the 2×RL and 10×RL lines passing through that switchbox 460".

A first plurality of 48 'taps' are provided on the first-stage ISM 430" for accessing adjacent and horizontal ones of the 2×RL's. A second plurality of 48 more 'taps' are provided on the first-stage ISM 430" for accessing adjacent and vertical ones of the 2×RL's. These 96 taps allow the first-stage ISM 430" to selectively acquire signals from a respective 96 duo-reach access wires associated with bus 433 (and with duo-deca switchbox 460"). The selected subset of the 96 tap-able duo signals (433) that may be acquired by ISM-1 can then be routed to ISM-2 (440") via the interstage bus 435. Although FIGS. 4A–4B show only 32 horizontal 2×RL lines and 32 vertical 2×RL lines provided across adjacent interconnect channels of each GLB (e.g., 401). The reason why this arrangement nonetheless effectively translates into 96 unique signal taps at the ISM-1 stage is because the bundles of 2×RL lines passing through each duo-deca switchbox can be designated as belonging to one of three groups: those 2×RL lines whose middle taps are passing-through the box; those 2×RL lines whose top (T) or left side (L) is terminating in the box; and those 2×RL lines whose bottom (B) or right (R) side is terminating in the box. Each group has 16 vertical or 16 horizontal 2×RL lines in it. There are 3 vertical groups of this type and 3 horizontal groups of this type extending into each switchbox. Hence we have 48 horizontal lines plus 48 vertical lines, thereby defining a total of 96 tap-able 2×RL lines extending into each corresponding switchbox.

While substantially equivalent coupling into the associated BOSM 450" is provided for all eight (8) of the respective GLB result signals W0, W1, . . . , Z1 that are output pair-wise and respectively from the four Configurable Building Blocks (CBB's, e.g., 402) shown in FIG. 4C, namely, from the W, X, Y and Z CBB's of GLB 401"; by contrast, in the illustrated embodiment only the W0, X0, Y0 and Z0 output signals (4 signals) of the respective W-Z CBB's couple to the H- and to the V-longline OSM's 480". The latter couplings are denoted as W0', X0', Y0' and Z0' in FIG. 4C and dashed lines are used to schematically used to represent their direct connections from the W0, X0, Y0 and Z0 output terminals. (The Y0–Y0' dashed line connection is implicit even though not shown.) It is therefore understood that W0' equals W0, X0' equals X0, and so on. Also, as already explained, the illustrated BOSM and LOSM structures of FIG. 4C can be physically integrated to define a general OSM (Output Switch Matrix) structure and that slices of such an integrated OSM can be respectively associated with respective GLB's.

The illustrated, Longline OSM's 480" (LOSM) may be collectively thought of as comprising an intersecting set of four horizontal, matrix input lines (H4) and twenty-four vertical, matrix output lines (V24) whose intersections are fully populated by a set of ninety-six PIP's. As a result, any of the W0, X0, Y0 and Z0 signals may be routed to any one of twenty-four tristateable buffers associated with GLB 201. The latter tristateable buffers (486) receive their respective inputs from output lines 482" and 484 of the H&V longline OSM's 480". Symbols 485–486 represent the set of twenty-four (x24) tristateable longline drivers and their respective output enable terminals (OE). In one embodiment, 16 of the twenty-four MaxRL's that can be driven by the HVOSM 480" extend horizontally along the corresponding horizontal interconnect channel (HIC) adjacent to GLB 401" while the remaining 8 extend vertically along the corresponding vertical interconnect channel (VIC) adjacent to GLB 401".

An Input/Output Block (IOB) 420" is drawn as a dashed box in FIG. 4C to generally represent the interconnectability of GLB 401" to other GLB's and/or IOB's. A variety of different interconnect structures may be used for providing selective interconnection between GLB's and/or IOB's. In one embodiment, 10×RL lines such as those of bus 437 couple to associated IOB's 420" by way of duo-deca switchboxes such as the illustrated SWbox 465. The schematic depiction in FIG. 4C of the interconnectability of GLB 401" to other GLB's and/or IOB's is not intended to limit the internal structure of GLB 401" or the internal structure of IOB 420" or to limit the ways in which GLB 401" may be coupled to other circuitry. It merely provides an exemplary context for showing why 10×RL lines and/or like, intermediate-haul constructs (with fewer numbers of taps and thus fewer numbers of capacitive switch points) can have associated with them, shorter signal propagation times than those of corresponding other lines such as the MaxRL lines, or like connection constructs that can have taps going directly to substantially larger numbers of GLB's and/or IOB's.

Given the unique clustering of immediate destinations for deca-conveyed signals at two of the three tap points on each 10×RL line (e.g., in FIG. 2A, the taps denoted as 10.1, 10.2, 10.3—where one is the source and the other two serve as destinations), the place-and-route software (90, FIG. 1) may be urged to search for cluster-like, signal duplicating needs in supplied design problems and to take advantage of the 10×RL lines for duplicating input and/or control signals that conveniently are to be distributed in clusters that match to the taps of the 10×RL lines. The place-and-route software may additionally be urged to strive to exploit the option of using local feedback lines instead of a general interconnect lines for processing signals through unused parts of the variable granularity GLB's on an opportunistic basis. The combination of general purpose 10×RL lines and specialized feedback and/or direct-connect lines plus variable granularity GLB's creates a potent combination for optimizing utilization of on-chip resources in cases where cluster-like, signal duplication is to occur.

At this juncture, it may be beneficial to explain the term "strive" as it applies to what place-and-route software does. It is understood by those skilled in the art of FPGA configuration and of place-and-route software that many design factors may work in unison with, or in opposition to each other while place-and-route software is executing (run time) so as to pull the placement of two or more design components (e.g., where each design component, in the case of the present disclosure, may consume a GLB or a building block inside a GLB) either together toward a shared region of the FPGA or apart. The same concepts apply to routing operations. Because the placements of various design components get shuffled and their routings are re-done as place-and-route operations "anneal" into a convergent place-and-route solution, it is often the case that placement-directed and/or routing-directed "urging factors" are brought into competitive play with one another for urging respective design components to be placed in certain relations to one another and connected in one way or another. It is difficult to know in advance which urging factors will win and which will lose. Thus, the best that could be said in this regard is that certain urging factors should be "attached" to the placement and routing rules that might affect the re-partitionable components of a tightly-packed, and therefore-clusterizable, circuit design so as cause the place-and-route software to "strive" to partition the design appropriately and pack the components, and adjust their relative placements in close together GLB's so as to try to exploit the general interconnect (e.g., 2×RL and 10×RL lines) described herein. There is no guarantee that such will ultimately happen in a given run of the place-and-route software and for a given design implementation problem.

In one embodiment, there are no bridges other than the FT's for transferring signals from MaxRL lines to other interconnect conductors (e.g., 2×RL lines, 10×RL lines—if passed from the BOSM and through a switchbox). Accordingly, the feedthroughs (FT's) must be used in that embodiment if a signal that is being broadcast on a given MaxRL line is to be further distributed orthogonally or otherwise by other GLB-interconnect lines. The 2×RL and/or 10×RL lines may be used for such distribution of a given signal from a MaxRL line to a cluster of GLB's.

Referring to FIG. 5A, one possible implementation 500 of a main switchbox is shown at 560 and further detailed to show it has four staggered subboxes at locations 561, 562, 563 and 564. Each of subboxes 561–564 provides programmable routing as between different sets of Double-Reach Length and Deca-Reach Length lines. Subbox 561, for example, provides programmable routing between horizontal DecA lines DAH(0) through DAH(9), horizontal DouBle lines DBH(0–7), vertical 10×RL lines DAV(10–19), and vertical 2×RL lines DBV(8–15).

Figure 5B:
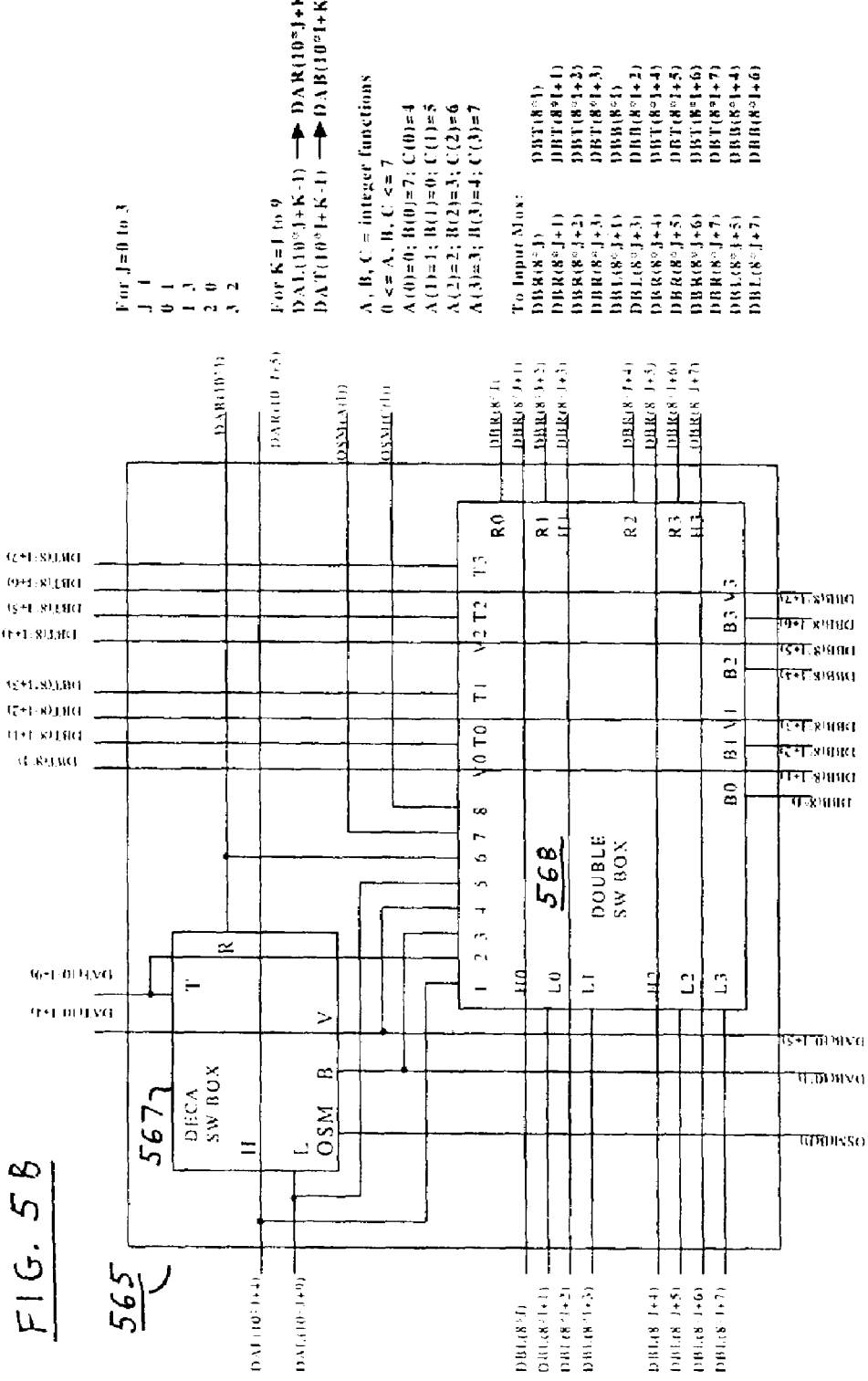
FIG. 5B is a block diagram showing more detail an exemplary subbox of a FIG. 5A.

Referring to FIG. 5B, a more detailed view of a model subbox 565 is shown to comprise a Deca switchbox area 567 and a Double switchbox area 568. Connections are from one tile to the next. Thus, the pass-through line H0 picks up Double line number DBL(8*J) on the left but becomes DBR(8*J+1) on the right, where this change of designation provides inter-tile braiding for select subsets of the interconnect lines.

Referring to FIG. 5C, a more detailed view of a model Double switchbox area 568' is shown. The terminal designations are the same as those of area 568 in FIG. 5B. The numbered and heavily darkened circles represent PIP connections between corresponding horizontal and/or vertical lines. Where practical, like reference symbols for Left, Right, Top, Bottom, Horizontal-middle and Vertical-middle taps are used. While the illustrated embodiment shows one set of programmable navigation paths, other rules for navigation between Doubles and Decas are of course possible. The implications of changes should be considered for their larger picture impact on the interconnect weave of the FPGA taken as a whole.

FIG. 6 is a block diagram of an embodiment 600 in which Double-Reach Length buses are braided. In each interconnect channel (HIC or VIC) there are 32 Double-Reach Length lines. The 32 lines are divided into symmetrically braided bundles of 16 lines each. Immediately adjacent processing/routing nodes (e.g., 610) have their L and R taps on one horizontal bundle or the next while the H taps are on the other bundle as shown. Similarly, they have their T and B taps on one vertical bundle or the next while the V taps are on the other bundle as shown. This helps the place-and-route software to avoid signal collision when trying to symmetrically route signals from immediately adjacent processing/routing nodes.

Figure 7:
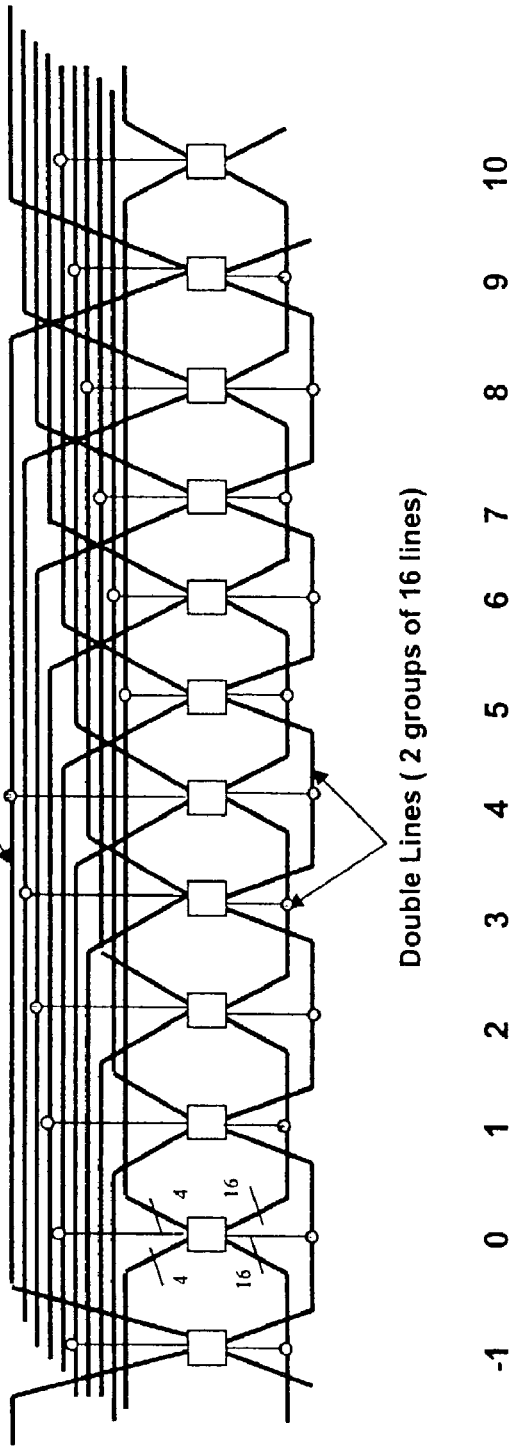
FIG. 7 is a further block diagram of the embodiment of FIG. 6 showing staggered terminations of Deca-Reach Length lines.

FIG. 7 is a further block diagram of an embodiment 700 in accordance with that of FIG. 6. FIG. 7 shows staggered terminations for the Deca-Reach Length lines. They are divided into 10 groups of 4 Deca-Reach Length lines each and the groups terminate in staggered fashion as shown. Middle taps to the 10×RL line groups are also shown. To avoid illustrative clutter, only the horizontal lines are shown. The pattern may repeat for the vertical lines as well. For the given embodiment, each processing/routing node can drive respective output signals to one 10×RL line designated as Top relative to the node (1 Top Deca), 1 Bottom Deca, 1 Left Deca and 1 Right Deca. Each processing/routing node can further drive respective output signals to two 2×RL lines designated as Top relative to the node (2 Top Doubles), 2 Bottom Doubles, 2 Left Doubles, 2 Right Doubles, 1 Horizontal middle tap point of a corresponding horizontal Doubles line and 1 Vertical middle tap point of a corresponding vertical Doubles line.

While not illustrated in detail, it is within the contemplation of the disclosure to provide within computer-readable media (e.g., floppy diskettes, CD-ROM, DVD-ROM) and/or within manufactured and/or transmitted data signals, FPGA-configuring bit streams for programmably configuring a hierarchical general interconnect in accordance with the above disclosure and/or to provide computer-understandable instructions to computers for causing the computers to perform automated place-and-route operations for the automated generation of FPGA configuration data in accordance with the present disclosure.

Reservation of Extra-Patent Rights, Resolution of Conflicts, and Interpretation of Terms After this disclosure is lawfully published, the owner of the present patent application has no objection to the reproduction by others of textual and graphic materials contained herein provided such reproduction is for the limited purpose of understanding the present disclosure of invention and of thereby promoting the useful arts and sciences. The owner does not however disclaim any other rights that may be lawfully associated with the disclosed materials, including but not limited to, copyrights in any computer program listings or art works or other works provided herein, and to trademark or trade dress rights that may be associated with coined terms or art works provided herein and to other otherwise-protectable subject matter included herein or otherwise derivable herefrom.

If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls.

Unless expressly stated otherwise herein, ordinary terms have their corresponding ordinary meanings within the respective contexts of their presentations, and ordinary terms of art have their corresponding meanings within the relevant technical arts and within the respective contexts of their presentations herein.

The present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, use of equivalent functional couplings for couplings described herein, and/or use of equivalent functional steps for steps described herein. Such insubstantial variations are to be considered within the scope of what is contemplated here. Moreover, if plural examples are given for specific means, or steps, and extrapolation between and/or beyond such given examples is obvious in view of the present disclosure, then the disclosure is to be deemed as effectively disclosing and thus covering at least such extrapolations.

Given the above disclosure of general concepts and specific embodiments, the scope of protection sought is to be defined by the claims appended hereto. The issued claims are not to be taken as limiting Applicant's right to claim disclosed, but not yet literally claimed subject matter by way of one or more further applications including those filed pursuant to 35 U.S.C. §120 and/or 35 U.S.C. §251.

What is claimed is:

1. A field programmable gate array (FPGA) comprising:
   (a) a plurality of nodes;
   (b) a plurality of general interconnect lines that can be used to transmit interconnect-conveyed signals from respective source nodes to corresponding destination nodes, wherein said general interconnect lines include:
   (b.1) a first plurality of first span length lines each respectively spanning a first span length and each having a first number of tap points, where the first span length is at least that spanning three of said processing/routing nodes and the tap points in said first number of tap points respectively couple to the at least three of the nodes spanned by the respective first span length line; and
   (b.2) a second plurality of second span length lines each respectively spanning a second span length and each having a second number of tap points, where the second span length is greater than the first span length so that each respective, second span length line spans more nodes than the number of nodes spanned by the first span length lines, and where the tap points in said second number of tap points respectively couple to less than all the nodes spanned by the respective second span length line.

2. The FPGA of claim 1 wherein:
   (a.1) said programmable nodes are processing/routing nodes each having one or more programmably selectable, logic functions and/or one or more programmably selectable, data storage functions and one or more programmably selectable, interconnect-signal routing functions; and
   (b.1) said plurality of general interconnect lines can be used to transmit interconnect-conveyed signals from respective source nodes to corresponding destination nodes by way of corresponding interconnect-signal routing functions selected in the source and destination nodes and by way of corresponding interconnect-signal routing functions selected in intervening nodes if any.

3. The FPGA of claim 1 wherein:
   (b.3) the ratio of the first span length to the second span length is less than about 1/2.

4. The FPGA of claim 1 wherein:
   (b.3) the ratio of the first span length to the second span length is about 2/10.

5. The FPGA of claim 1 wherein:
   (b.3) the ratio of the first number of tap points to the second number of tap points is about 1/1.

6. The FPGA of claim 1 wherein:
   (b.2a) the second span length spans at least 11 of said processing/routing nodes.

7. The FPGA of claim 6 wherein:
   (b.1a) the first span length spans 3 of said processing/routing nodes.

8. The FPGA of claim 7 wherein:
   (b.2b) second number of tap points is 3.

9. The FPGA of claim 1 wherein:
   (b.2a) the tap points in said second number of tap points are symmetrically distributed between ends of each respective second span length line.

10. The FPGA of claim 1 wherein:
    (a.1) said nodes include buffered drive resources for driving respective ones of said second span length lines and input receiving resources for receiving signals from associated ones of the general interconnect lines; and
    (b.2a) for each respective second span length line at least two of the tap points in said second number of tap points are coupled to corresponding buffered drive resources while at least one of the tap points is not coupled to a corresponding buffered drive resource.

11. The FPGA of claim 10 wherein:
    (b.2a1) for each respective second span length line at least two terminal end tap points in said second number of tap points are coupled to corresponding buffered drive resources, the terminal end tap points being disposed at opposed ends of the respective second span length line.

* * * * *